(12) United States Patent
Li et al.

(10) Patent No.: US 8,908,435 B2
(45) Date of Patent: Dec. 9, 2014

(54) ERASE OPERATION WITH CONTROLLED SELECT GATE VOLTAGE FOR 3D NON-VOLATILE MEMORY

(75) Inventors: Haibo Li, Sunnyvale, CA (US); Xiying Costa, San Jose, CA (US); Chenfeng Zhang, San Jose, CA (US)

(73) Assignee: SanDisk Technologies Inc., Plano, TX (US)

(*) Notice: Subject to any disclaimer, the term of this patent is extended or adjusted under 35 U.S.C. 154(b) by 242 days.

(21) Appl. No.: 13/332,844

(22) Filed: Dec. 21, 2011

(65) Prior Publication Data

US 2013/0163336 A1 Jun. 27, 2013

(51) Int. Cl.
*G11C 16/16* (2006.01)

(52) U.S. Cl.
USPC ............ 365/185.17; 365/185.22; 365/185.19; 365/185.26; 365/185.12; 365/185.13; 365/185.29; 365/51; 365/63

(58) Field of Classification Search
USPC ............ 365/185.12, 185.13, 185.11, 185.17, 365/185.22, 185.19, 185.18, 185.26, 365/185.29, 51, 72, 63
See application file for complete search history.

(56) References Cited

U.S. PATENT DOCUMENTS

| | | | |
|---|---|---|---|
| 6,009,014 A | 12/1999 | Hollmer et al. | |
| 6,982,905 B2 * | 1/2006 | Nguyen | 365/185.17 |
| 6,987,696 B1 | 1/2006 | Wang et al. | |
| 7,251,161 B2 | 7/2007 | Yano et al. | |
| 7,881,114 B2 | 2/2011 | Park et al. | |
| 7,924,622 B2 | 4/2011 | Lee et al. | |
| 8,228,738 B2 * | 7/2012 | Park et al. | 365/185.17 |
| 8,358,544 B2 | 1/2013 | Kang | |
| 2010/0172189 A1 | 7/2010 | Itagaki et al. | |
| 2011/0013461 A1 | 1/2011 | Shiino et al. | |
| 2011/0063914 A1 | 3/2011 | Mikajiri et al. | |
| 2011/0157989 A1 | 6/2011 | Iwata | |
| 2011/0199825 A1 | 8/2011 | Han et al. | |
| 2011/0249503 A1 | 10/2011 | Yamada et al. | |
| 2011/0267888 A1 | 11/2011 | Dutta et al. | |

OTHER PUBLICATIONS

Search Report and Written Opinion in PCT/US2012/065739, 12 pages, Mar. 15, 2013.
Notice of Allowance dated Jul. 2, 2014, U.S. Appl. No. 14/254,586 filed Apr. 16, 2014.

* cited by examiner

*Primary Examiner* — Andrew Q Tran
(74) *Attorney, Agent, or Firm* — Vierra Magen Marcus LLP

(57) ABSTRACT

An erase process for a 3D stacked memory device controls a drain-side select gate (SGD) and a source-side select gate (SGS) of a NAND string. In one approach, SGD and SGS are driven to provide a predictable drain-to-gate voltage across the select gates while an erase voltage is applied to a bit line or source line. A more consistent gate-induced drain leakage (GIDL) at the select gates can be generated to charge up the body of the NAND string. Further, the select gate voltage can be stepped up with the erase voltage to avoid an excessive drain-to-gate voltage across the select gates which causes degradation. The step up in the select gate voltage can begin with the first erase-verify iteration of an erase operation, or at a predetermined or adaptively determined erase-verify iteration, such as based on a number of program-erase cycles.

28 Claims, 25 Drawing Sheets

Fig. 1A1
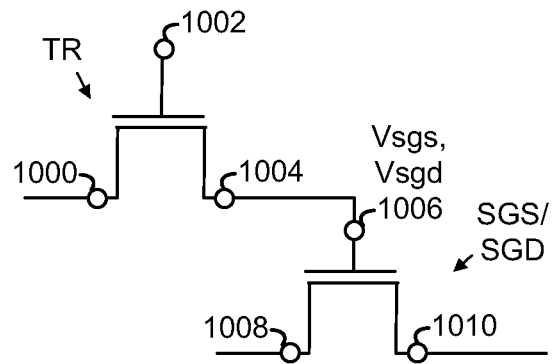
Fig. 1A2
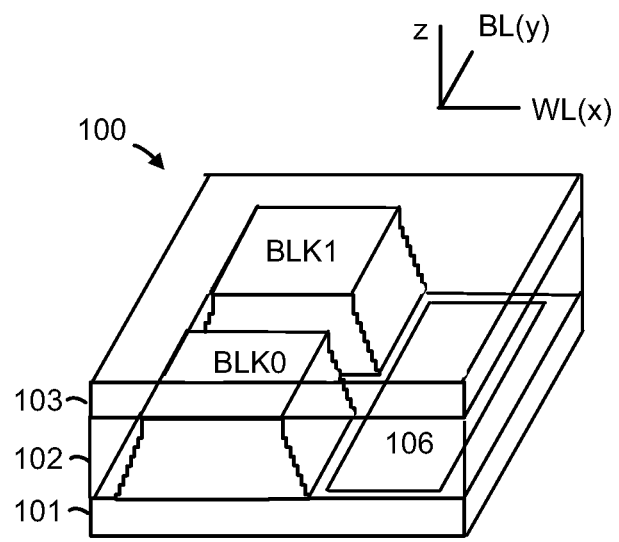

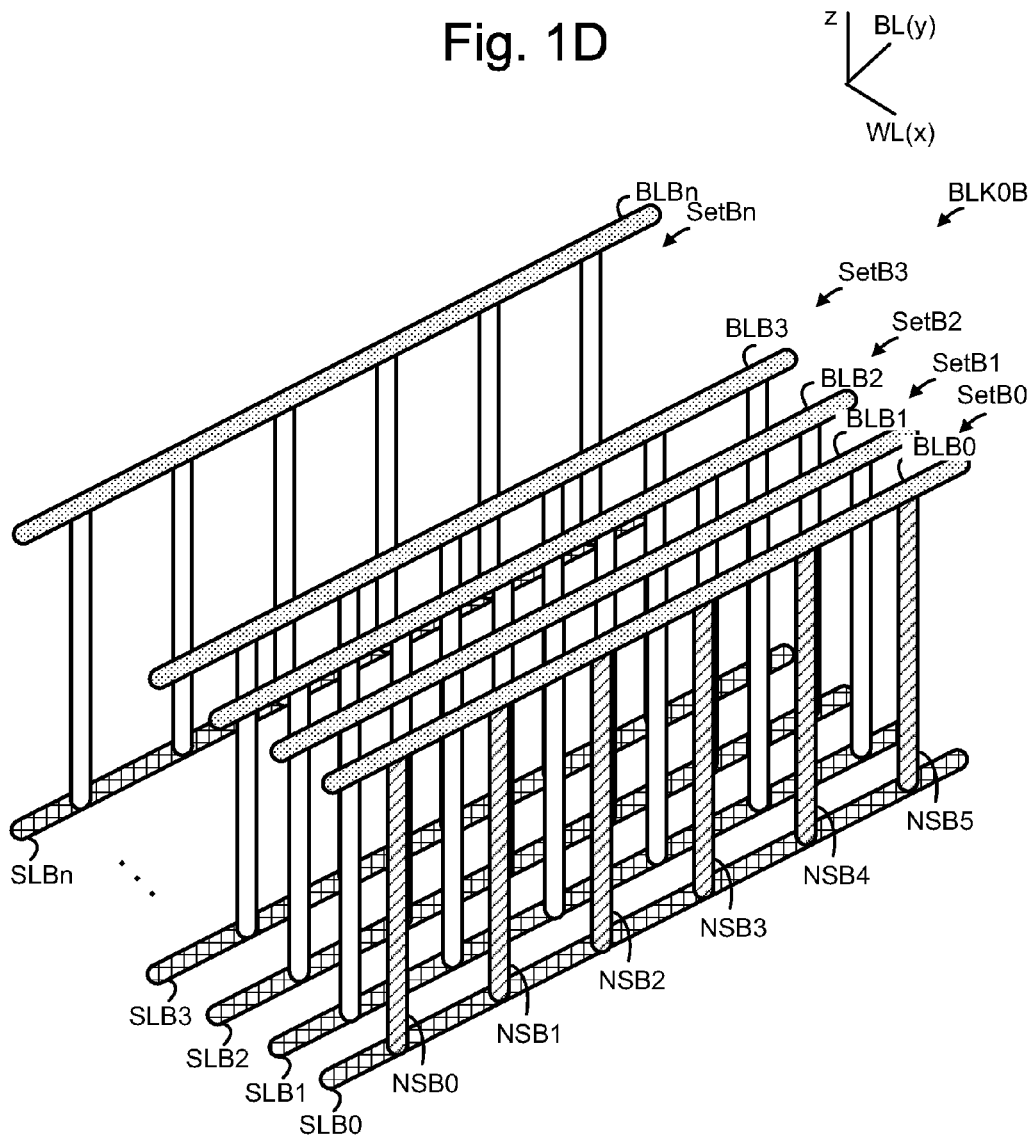

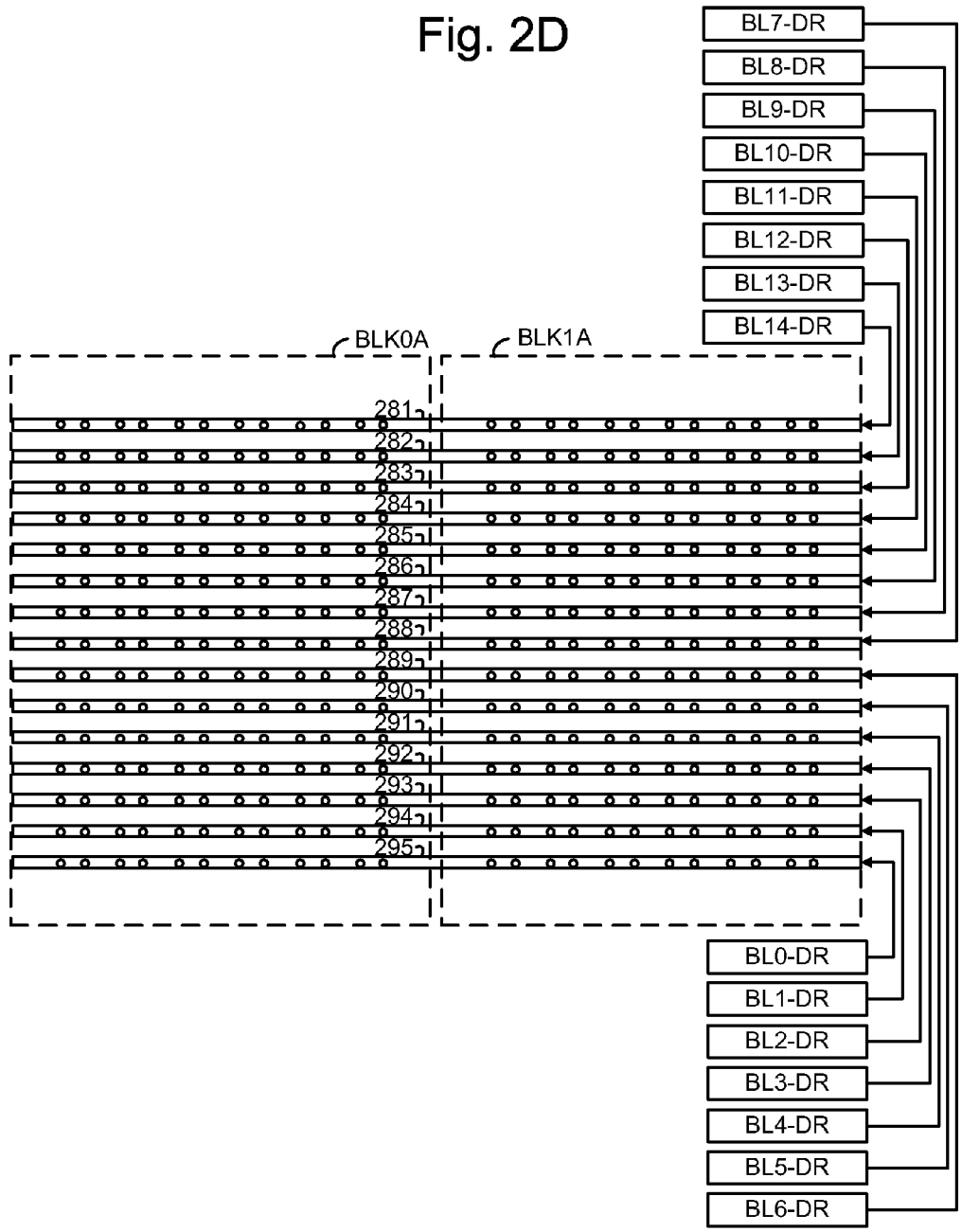

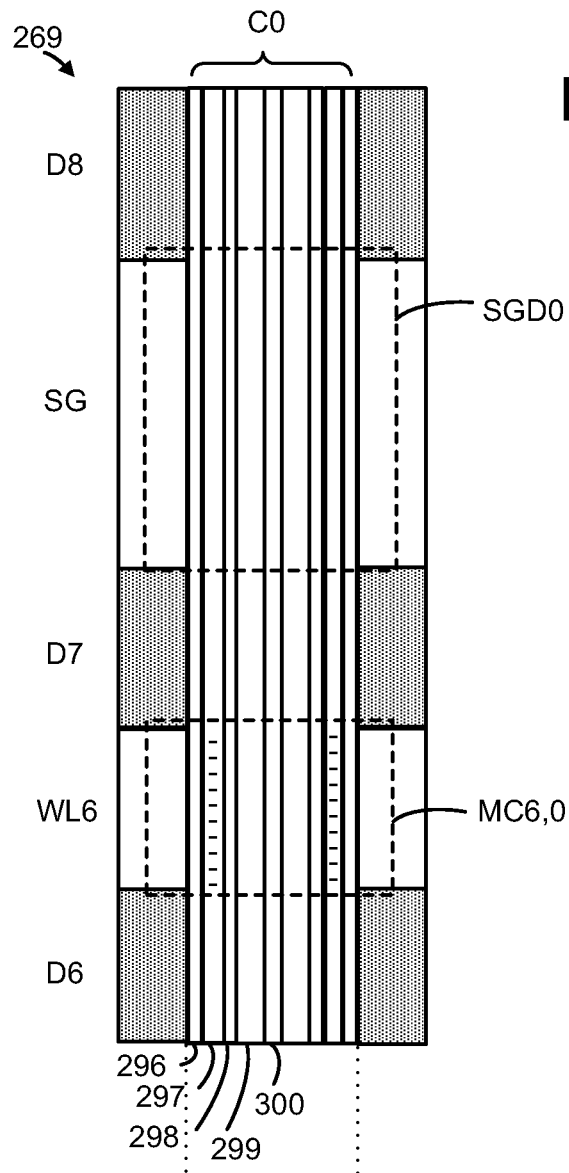
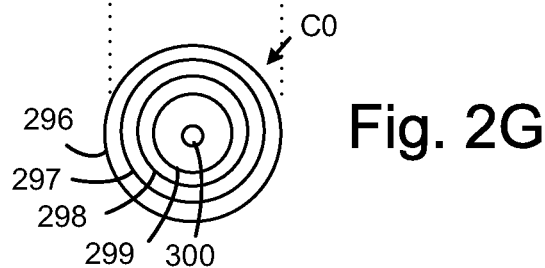

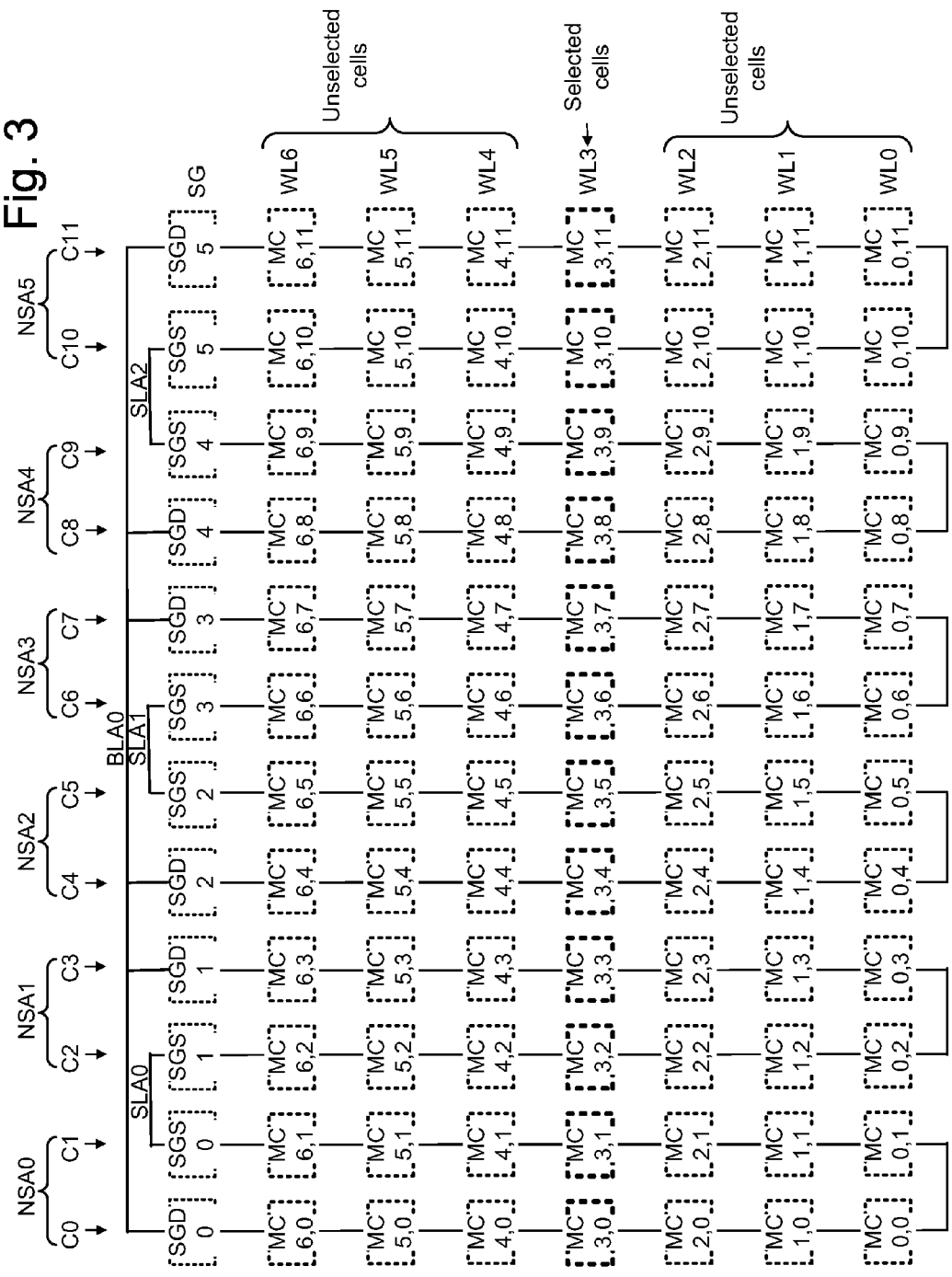

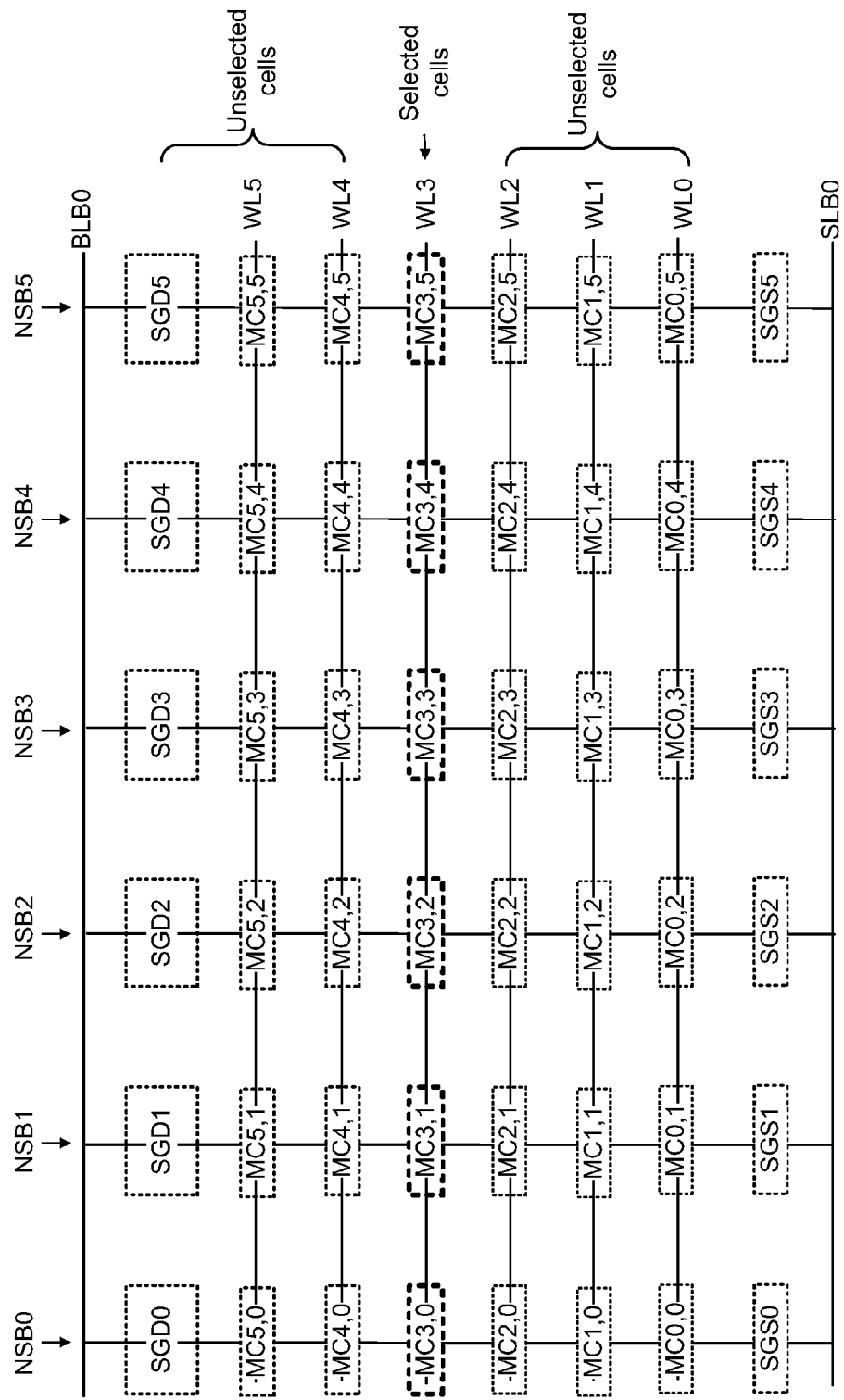

ERASE OPERATION WITH CONTROLLED SELECT GATE VOLTAGE FOR 3D NON-VOLATILE MEMORY

BACKGROUND OF THE INVENTION

1. Field of the Invention

The present invention relates to techniques for erasing memory cells in a 3D-non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 1A1 depicts a transfer (TR) transistor and an SGS/SGD transistor.

FIG. 1A2 is a perspective view of a 3D stacked non-volatile memory device.

FIG. 1D depicts an embodiment of block BLK0 of FIG. 1A2 which includes straight NAND strings.

FIG. 2D depicts a top view of a bit line layer of the 3D non-volatile memory device of FIG. 2A, showing bit lines and associated drivers.

FIG. 2F depicts a close-up view of the region 269 of the column C0 of FIG. 2E, showing a drain-side select gate SGD0 and a memory cell MC6,0.

FIG. 2G depicts a cross-sectional view of the column C0 of FIG. 2F.

FIG. 3 depicts an arrangement of memory cells in an example set of NAND strings such as SetA0 in FIG. 2E.

FIG. 6A depicts one embodiment of Vsl and Vbl for selected and inhibited NAND strings during the erase portion of an erase-verify iteration.

FIG. 6B depicts one embodiment of Vsgs and Vsgd for selected and unselected sub-blocks during the erase portion of an erase-verify iteration.

FIG. 6C depicts Vbody for selected and inhibited NAND strings during the erase portion of an erase-verify iteration.

FIG. 6D depicts Vth for a selected memory cell during the erase portion of an erase-verify iteration.

FIG. 6E depicts Vwl for selected and unselected word lines during the erase portion of an erase-verify iteration.

FIG. 6F depicts another embodiment of Vsl and Vbl for selected NAND strings during the erase portion of an erase-verify iteration.

FIG. 6G depicts another embodiment of Vsl and Vbl for inhibited NAND strings during the erase portion of an erase-verify iteration.

FIG. 6H depicts another embodiment of Vsgs and Vsgd for selected and inhibited sub-blocks during the erase portion of an erase-verify iteration.

FIG. 7A depicts Vbl during the verify portion of an erase-verify iteration.

FIG. 7B depicts Vbsgs and Vsgd during the verify portion of an erase-verify iteration.

FIG. 7C depicts Vwl for selected and unselected word lines during the verify portion of an erase-verify iteration.

FIG. 9 depicts an arrangement of memory cells in an example set of NAND strings such as SetB0 in FIG. 8F.

DETAILED DESCRIPTION

Figure 1B:
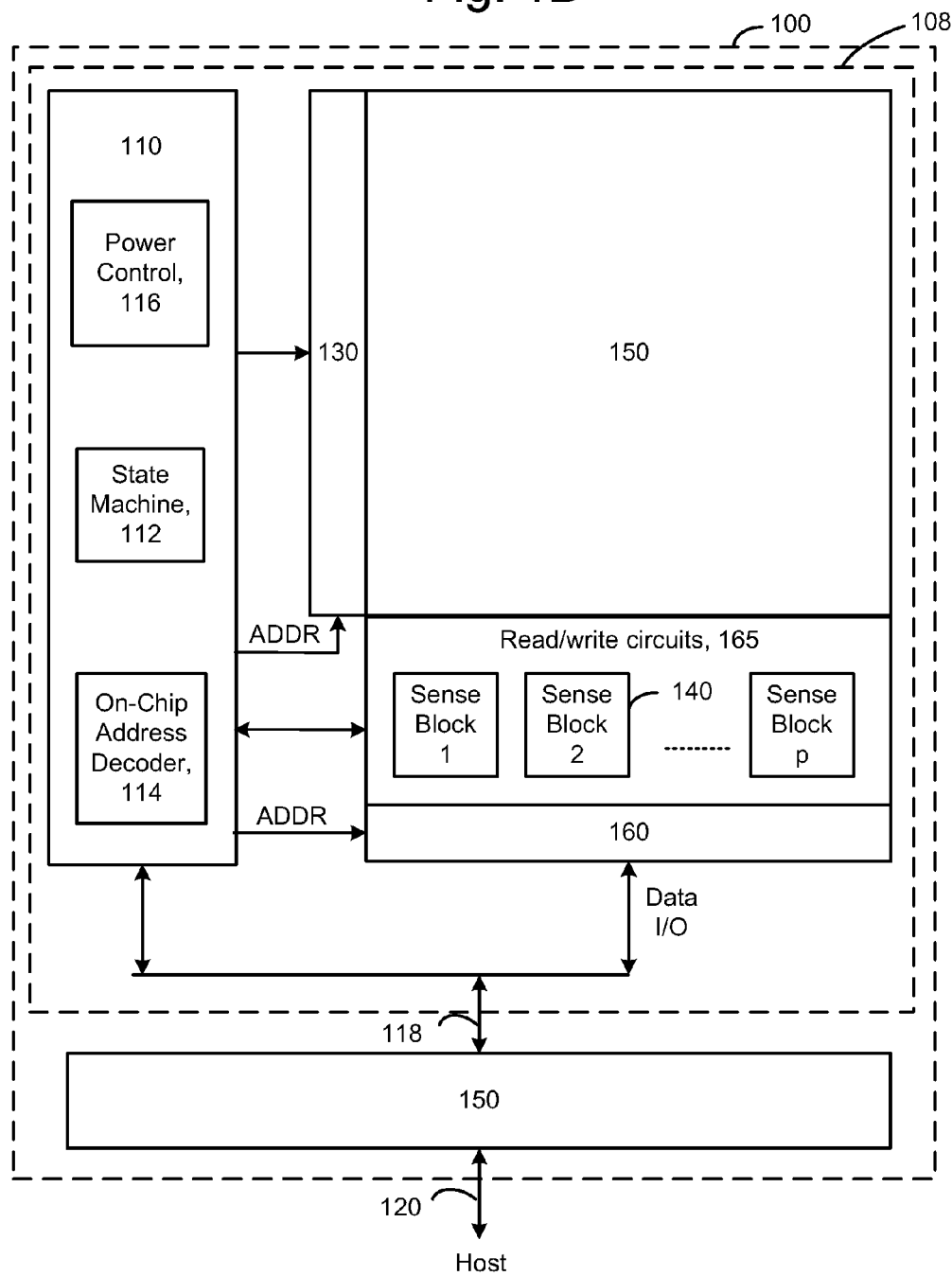
FIG. 1B is a functional block diagram of the 3D stacked non-volatile memory device 100 of FIG. 1A2.

A 3D stacked non-volatile memory device can be arranged in multiple blocks, where typically an erase operation is performed one block at a time. An erase operation can include multiple erase-verify iterations which are performed until an erase-verify condition is met for the block, at which point the erase operation ends. In one approach, the memory device includes NAND strings which have a drain-side select gate (SGD) on one end and a source-side select gate (SGS) on the other end. The select gates play an important role in an erase operation because they are used to generate a sufficient amount of gate-induced drain leakage (GIDL) current to charge up the floating body of the NAND string in a reasonable time frame. GIDL increases in proportion to the drain-to-gate voltage (Vdg). If the select gates are floated while erase voltages are applied to the bit lines and/or source line, the select gates will be coupled to a higher voltage which is hard to control. As a result, the amount of GIDL which is generated is also hard to control, and the time required to charge up the floating body can become excessive. GIDL current could be controlled by adjusting the core recess height or by adjusting the doping level of the drain by in-situ n+ doping, but this requires modifying the fabrication process. Another problem is that a select gate can degrade due to a large Vdg difference across the select gate.

For example, FIG. 1A1 depicts a transfer (TR) transistor and an SGS/SGD transistor. The TR transistor includes a gate node 1002 connected to a driving transfer voltage Vtr, a drain node 1000 connected to a voltage driver, and a source node 1004. An SGS/SGD transistor includes a gate node 1006 connected to the node 1004 (receiving a control gate voltage Vcg, also referred to as Vsgs for an SGS transistor and Vsgd for an SGD transistor), and source/drain nodes 1008 and 1010. For example, as an SGD transistor, the node 1008 is a drain node connected to a bit line (at Vbl) and the node 1010 is a source node connected to the memory cells of a NAND string. The drain-to-gate voltage across the SGD transistor is Vdg=Vbl−Vcg. As an SGS transistor, the node 1008 is a drain node connected to a source line (at Vsl) and the node 1010 is a source node connected to the memory cells of a NAND string. The drain-to-gate voltage across the SGS transistor is Vdg=Vsl−Vcg.

In the approach in which the select gates are floated while erase voltages are applied to the bit lines and/or source line, the erase portion of an erase-verify iteration includes first and second steps. The first step applies Voff (e.g., 0 V or a negative voltage) to node 1000 and Vdd (>Voff) to the node 1002 so that 0 V is passed to nodes 1004 and 1006. Vdd is also applied to node 1008. With these bias conditions, weak GIDL could be generated. The second step applies Vdd to node 1000 so that the node 1006 is at Vdd−Vth, where Vth is the threshold voltage of the TR transistor, with the body effect considered. Node 1008 is increased from Vdd to Verase>Vdd, causing the voltage at node 1006 (e.g., Vsgd) to be coupled to Vdd−Vth+c*(Verase−Vdd), where c is a coupling ratio. The coupling ratio accounts for, e.g., a capacitance between the select gate line (node 1006) and bit line (node 1008), between nodes 1004 and 1006, and ground, and between the bit line (node 1008) and ground. The voltage difference between the bit line (node 1008) and the select gate (node 1006, Vsgd) is then Verase−(Vdd−Vth+c*(Verase−Vdd))=(1−c)*(Verase−Vdd)+Vth. This indicates that GIDL largely depends on the coupling ratio, which is not easily controllable/predictable. The driving force is compromised by a factor of 1−c.

One approach to control GIDL is to drive a select gate to achieve a desired drain-to-gate voltage difference across the select gate, resulting in a more predictable level of GIDL and charge up time. For example, the first step of the erase portion ramps nodes 1000 and 1008 from 0 V to Vsg. Node 1002 is set at a relatively high level which passes Vsg to nodes 1004 and 1006. The second step of the erase portion maintains Vsg at node 1000 and ramps the voltage at node 1008 from Vsg to Verase>Vsg. Vsg can be adjusted and synchronized relative to Vsl/Vbl and Vsgd/Vsgs. In this case, Vdg=Vbl−Vcg=Verase−Vsg. In case of multiple erase-verify iterations, Verase can be stepped up by a predefined step size, Verase-step. Moreover, Vsg can also be adjusted by a step size Vsg-step depending on the degradation of the select gates. In one approach, Vsg-step is higher when a number of program-erase cycles is higher.

Thus, a select gate can be driven based on a level of an erase voltage which is applied to the drain end (bit line end) or source end of a NAND string. In one embodiment, the select gate is driven at a fixed level in the erase portion of each erase-verify iteration. In another option, the select gate voltage is stepped up in the erase portion of each erase-verify iteration, starting with the second erase-verify iteration. In another option, the select gate voltage is stepped up in the erase portion of each erase-verify iteration starting with an erase-verify iteration which is predetermined (e.g., the third or fourth erase-verify iteration) or adaptively determined. Regarding the adaptive approach, the step-up may begin based on a number of program-erase cycles which the memory device or portion thereof (e.g., block) has experienced. For instance, the step-up can occur sooner when the number of program-erase cycles is greater, when the select gates are more degraded. By stepping up the select gate voltage with the erase voltage, increasingly higher drain-to-gate voltage differences across the select gates are avoided (e.g., the drain-to-gate voltage difference can be fixed), so that their degradation is reduced.

In the discussion below, structural details of 3D stacked non-volatile memory devices are provided generally in FIGS. 1A2 to 3 and 8A to 9, and details of an erase operation are provided generally in FIGS. 4 to 7C.

FIG. 1A2 is a perspective view of a 3D stacked non-volatile memory device. The memory device 100 includes a substrate 101. On the substrate are example blocks BLK0 and BLK1 of memory cells and a peripheral area 106 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

FIG. 1B is a functional block diagram of the 3D stacked non-volatile memory device 100 of FIG. 1A2. The memory device 100 may include one or more memory die 108. The memory die 108 includes a 3D (three-dimensional) memory array of storage elements 150, e.g., including the blocks BLK0 and BLK1, control circuitry 110, and read/write circuits 165. The memory array 150 is addressable by word lines via a row decoder 130 and by bit lines via a column decoder 160. The read/write circuits 165 include multiple sense blocks 140 (sensing circuitry) and allow a page of storage elements to be read or programmed in parallel. Typically a controller 150 is included in the same memory device 100 (e.g., a removable storage card) as the one or more memory die 108. Commands and data are transferred between the host and controller 150 via lines 120 and between the controller and the one or more memory die 108 via lines 118.

The control circuitry 110 cooperates with the read/write circuits 165 to perform memory operations on the memory array 150, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 140 can include bit line drivers, in one approach.

In some implementations, some of the components can be combined. In various designs, one or more of the components (alone or in combination), other than memory array 150, can be thought of as at least one control circuit. For example, at least one control circuit may include any one of, or a combination of, control circuitry 110, state machine 112, decoders 114/160, power control 116, sense blocks 140, read/write circuits 165, and controller 150, and so forth.

In another embodiment, a non-volatile memory system uses dual row/column decoders and read/write circuits. Access to the memory array 150 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 150. In this way, the density of the read/write modules is reduced by one half Other types of non-volatile memory in addition to NAND flash memory can also be used.

Figure 1C:
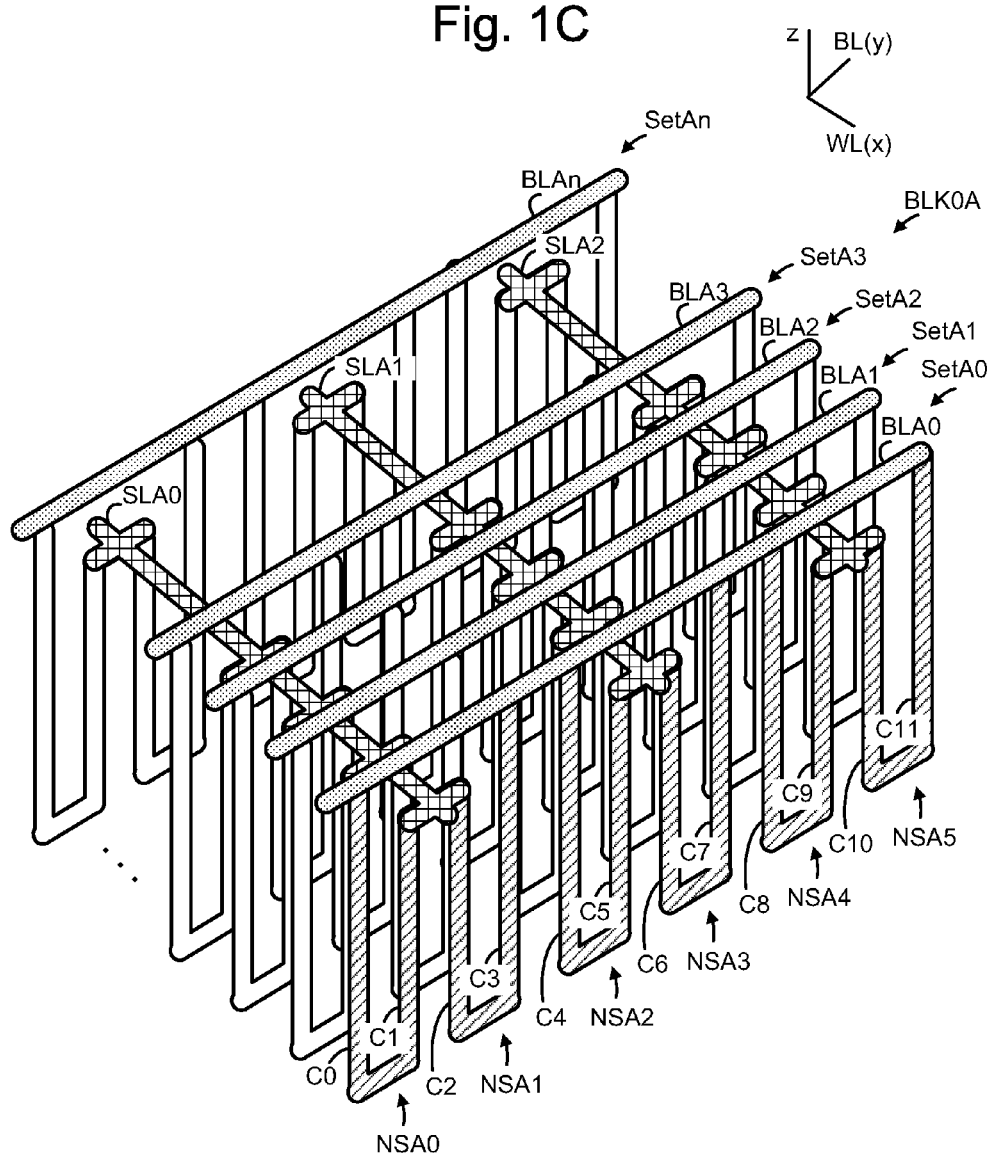
FIG. 1C depicts an embodiment of block BLK0 of FIG. 1A2 which includes U-shaped NAND strings.

FIG. 1C depicts an embodiment of block BLK0 of FIG. 1A2 which includes U-shaped NAND strings. The block BLK0A includes U-shaped NAND strings arranged in sets (SetA0, SetA1, SetA2, SetA3, . . . , SetAn, where there are n–1 sets in a block). Each set of NAND strings is associated with one bit line (BLA0, BLA1, BLA2, BLA3, . . ., BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

FIG. 1D depicts an embodiment of block BLK0 of FIG. 1A2 which includes straight NAND strings. The block BLK0B includes straight NAND strings arranged in sets (SetB0, SetB1, SetB2, SetB3, . . . , SetBn, where there are n–1 sets in a block). Each set of NAND strings is associated with one bit line (BLB0, BLB1, BLB2, BLB3, . . ., BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 2A:
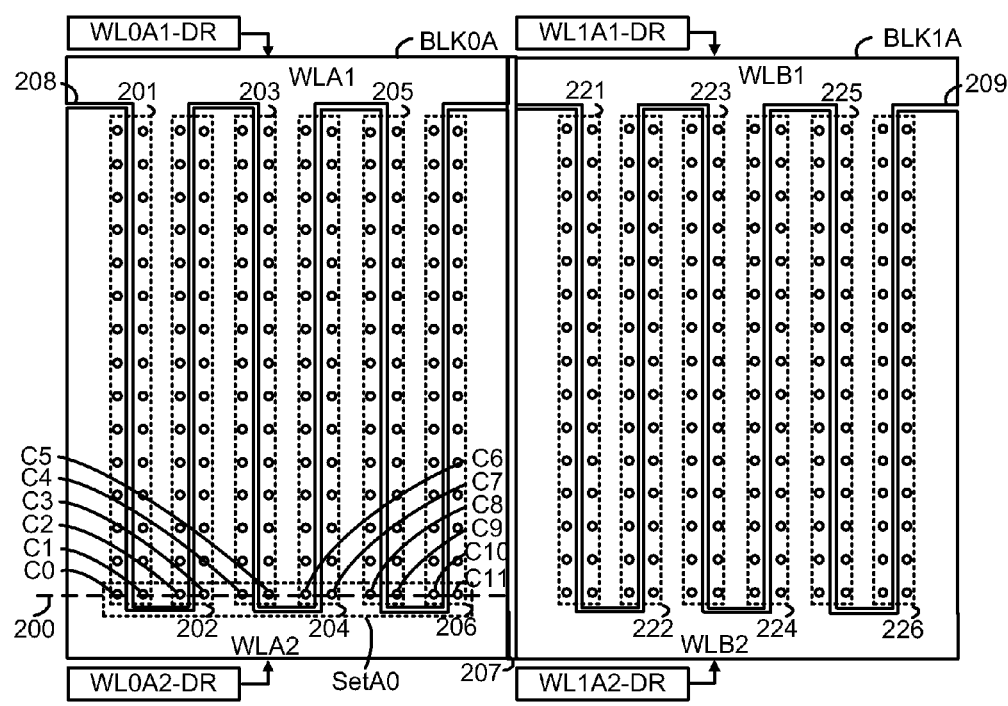
FIG. 2A depicts a top view of a word line layer of a 3D non-volatile memory device having U-shaped NAND strings, consistent with FIG. 1C, showing word line layer portions and associated drivers.

FIG. 2A depicts a top view of a word line layer of a 3D non-volatile memory device having U-shaped NAND strings, consistent with FIG. 1C, showing word line layer portions and associated drivers. This is a representative layer among the multiple word line layers in a stack. Referring also to FIG. 2E, the stack includes alternating dielectric and conductive layers. The dielectric layers include D0 to D8 and may be made of SiO2, for instance. The conductive layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. The word line layer of FIG. 2A may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 2A depicts the block BLK0A of FIG. 1C and a similar block BLK1A as an example. For each block, the word line layer is divided into two word line layer portions, e.g., word line layer portions WLA1 and WLA2 in BLK0A, and word line layer portions WLB1 and WLB2 in BLK1A. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 208 of BLK0A is a single continuous slit which extends in a zig-zag pattern in the block so that the block is divided into two portions, WLA1 and WLA2, which are insulated from one another. Similarly, a slit 209 of BLK1A divides BLK1A into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0A along a line 200 include C0 to C11. The figure represents a simplification, as many more rows of memory holes will typically be used, extending to the right and left in the figure. Also, the figures are not necessarily to scale. The columns of memory cells can be arranged in sub-blocks 201 to 206 in BLK0A and 221 to 226 in BLK1A. When U-shaped NAND strings are used, each sub-block can include two adjacent rows of columns of memory cells. In a sub-block, the adjacent rows are separated by the slit. The columns of memory cells on one side of the slit are drain-side columns (e.g., C0, C3, C4, C7, C8 and C11 in FIG. 2E), and the columns of memory cells on the other side of the slit are source-side columns (e.g., C1, C2, C5, C6, C9 and C10 in FIG. 2E). Note that the pattern of two source-side columns between two drain-side columns repeats in the y-direction.

Word line drivers WL0A1-DR, WL0A2-DR, WL1A1-DR and WL1A2-DR independently provide signals such as voltage waveforms to the word line layer portions WLA1, WLA2, WLB1 and WLB2, respectively.

The drawings are not to scale and do not show all memory columns. For example, a more realistic block might have 12 memory columns in the y direction as shown, but a very large number such as 32k memory columns in the x direction, for a total of 384k memory columns in a block. With U-shaped NAND strings, this is 192K NAND strings. With straight NAND strings, this is 384k NAND strings.

Figure 2B:
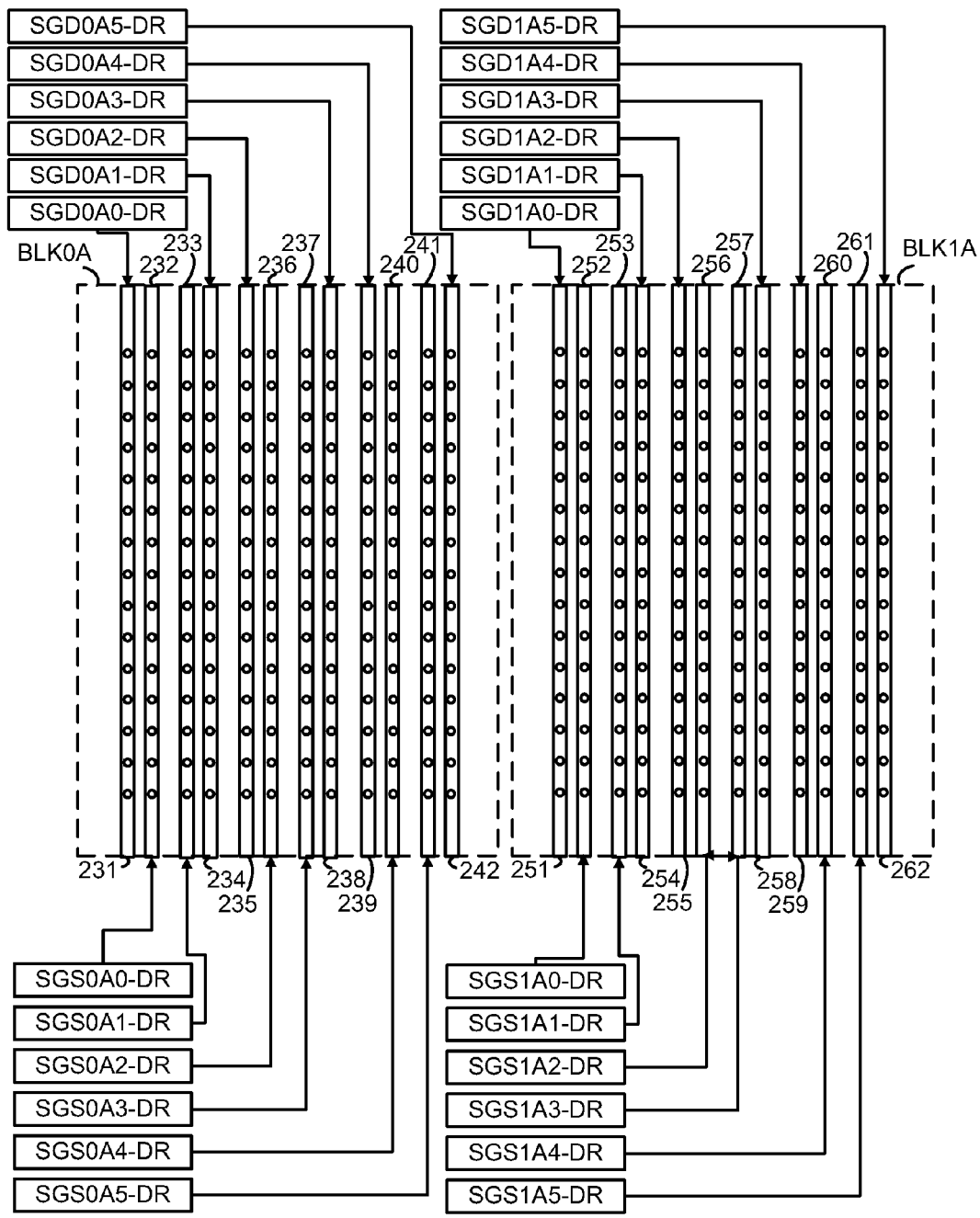
FIG. 2B depicts a top view of a select gate layer of the 3D non-volatile memory device of FIG. 2A, showing drain-side select gate lines, source-side select gate lines and associated drivers.

FIG. 2B depicts a top view of a select gate layer of the 3D non-volatile memory device of FIG. 2A, showing drain-side select gate lines, source-side select gate lines and associated drivers. For example, this can represent layer SG of FIG. 2E. A separate select gate line, e.g., a conductive line or path, is associated with each row of columns of memory cells. Moreover, separate select gate lines can be connected to the drain- and source-side columns of a U-shaped NAND string. For example, BLK0A includes drain-side select gate lines 231, 234, 235, 238, 239 and 242, which are driven by select gate drivers SGD0A0-DR to SGD0A5-DR, respectively, and source-side select gate lines 232, 233, 236, 237, 240 and 241, which are driven by select gate drivers SGS0A0-DR to SGS0A5-DR, respectively (DR denotes driver). Similarly, BLK1 includes drain-side select gate lines 251, 254, 255, 258, 259 and 262, which are driven by select gate drivers SGD6-DR to SGD11-DR, respectively, and source-side select gate lines 252, 253, 256, 257, 260 and 261, which are driven by select gate drivers SGS0A1-DR to SGS1A5-DR, respectively. The select gate drivers provide signals such as voltage waveforms to the select gate lines.

Figure 2C:
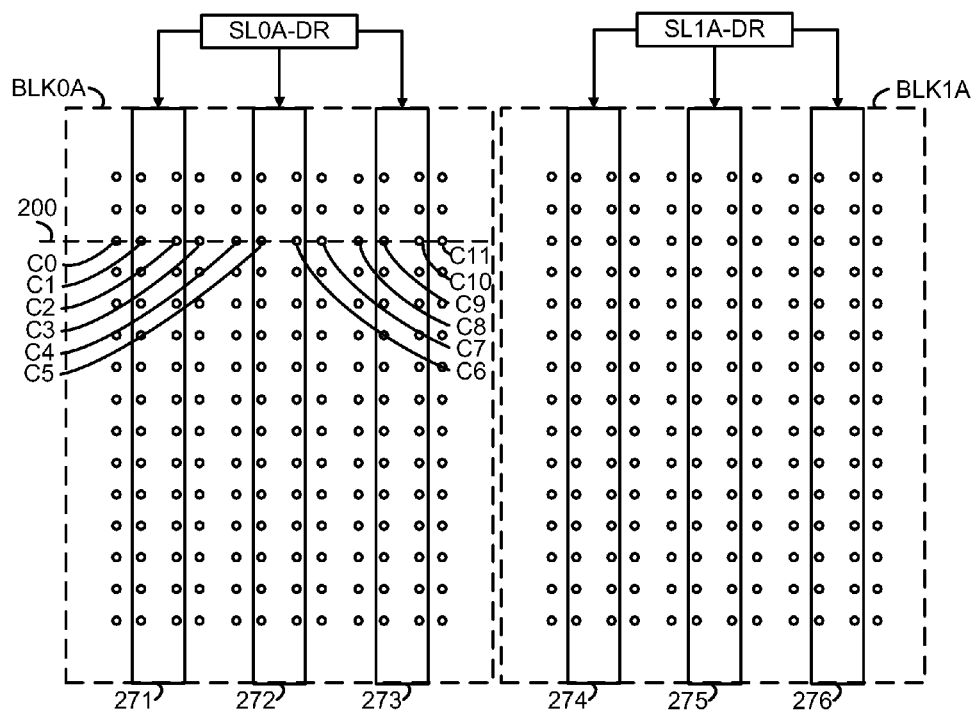
FIG. 2C depicts a top view of a source line layer of the 3D non-volatile memory device of FIG. 2A, showing source lines and associated drivers.
Figure 2E:
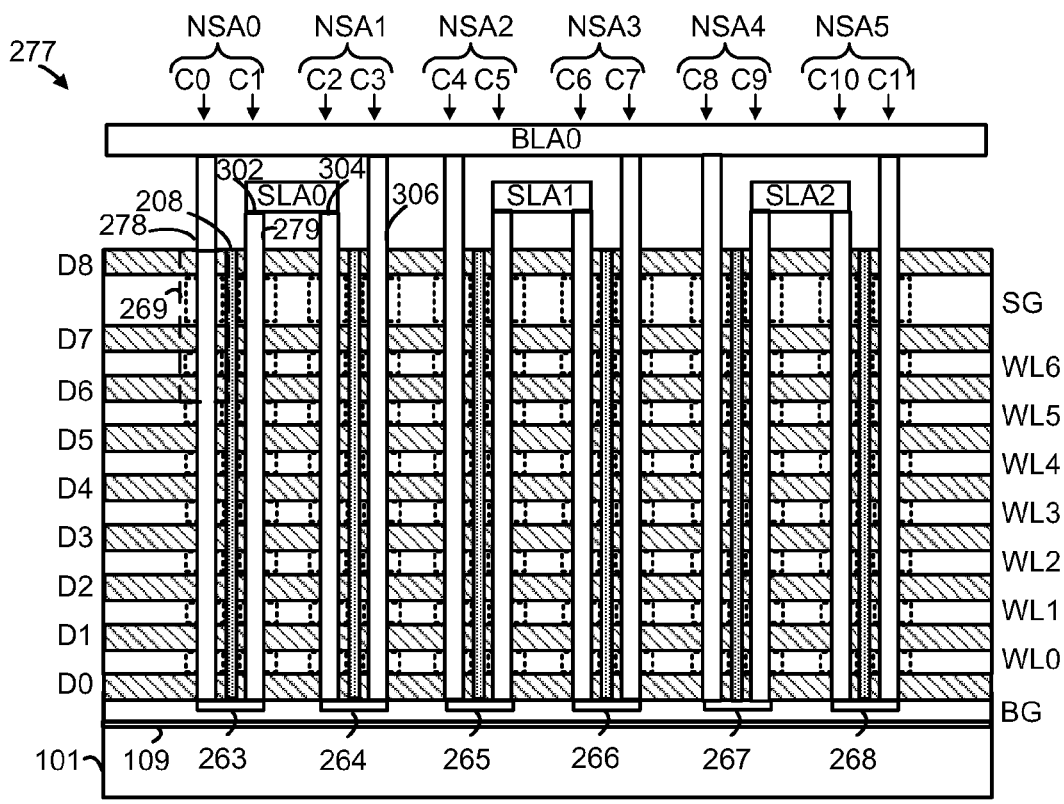
FIG. 2E depicts a cross-sectional view of a block of the 3D non-volatile memory device of FIG. 2A, along line 200 of SetA0 of NAND strings of FIG. 2A.

FIG. 2C depicts a top view of a source line layer of the 3D non-volatile memory device of FIG. 2A, showing source lines and associated drivers. For example, this can represent layer SL of FIG. 2E. A source line, e.g., a conductive line or path, is associated with pairs of rows of source-side columns of memory cells. A source line is connected to a source-side end of a U-shaped or straight NAND string. For example, BLK0A includes source lines 271 (e.g., connected to C0 and C1), 272 (e.g., connected to C5 and C6) and 273 (e.g., connected to C9 and C10). Similarly, BLK1A includes source lines 274, 275 and 276. The source line drivers provide signals such as voltage waveforms to the source lines. For example, SL0A-DR provides signals to source lines 271 to 273, and SL1A-DR provides signals to source lines 274 to 276.

FIG. 2D depicts a top view of a bit line layer of the 3D non-volatile memory device of FIG. 2A, showing bit lines and associated drivers. For example, this can represent layer BL of FIG. 2E. A bit line, e.g., a conductive line or path, is associated with a set of columns of memory cells which extend in a horizontal line in the figure. A bit line extends across multiple blocks which are adjacent laterally of one another. A bit line is connected to a drain-side end of a U-shaped or straight NAND string, e.g., to a vertical channel or body of the NAND string. For example, bit lines 281 to 295 are driven by bit line drivers BL0-DR to BL14-DR, respectively. The bit line drivers provide signals such as voltage waveforms to the ends of the NAND strings. Each bit line can be independently driven.

FIG. 2E depicts a cross-sectional view of a block of the 3D non-volatile memory device of FIG. 2A, along line 200 of SetA0 of NAND strings of FIG. 2A. Columns of memory cells C0 to C11 are depicted in the multi-layer stack. The stack 277 includes the substrate 101, an insulating film 109 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 268 which connect the columns. The back gate thus connects the two columns of each U-shaped NAND string. For example, NSA0 includes columns C0 and C1 and connecting portion 263. NSA0 has a drain end 278 and a source end 302. NSA1 includes columns C2 and C3 and connecting portion 264. NSA1 has a drain end 306 and a source end 304. NSA2 includes columns C4 and C5 and connecting portion 265. NSA3 includes columns C6 and C7 and connecting portion 266. NSA4 includes columns C8 and C9 and connecting portion 267. NSA5 includes columns C10 and C11 and connecting portion 268.

The source line SLA0 is connected to the source ends 302 and 304 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 277 extend behind the U-shaped NAND strings depicted in the cross-section, e.g., along the x-axis. The U-shaped NAND strings NSA0 to NSA5 are each in a different sub-block, but are in a common set of NAND strings (SetA0).

The slit portion 208 from FIG. 2A is also depicted as an example. In the cross-section, multiple slit portions are seen, where each slit portion is between the drain- and source-side columns of a U-shaped NAND string. Portions of the source lines 271 to 273 are also depicted. A portion of the bit line BLA0 is also depicted.

Short dashed lines depict memory cells and select gates, as discussed further below.

A region 269 of the stack is shown in greater detail in FIG. 2F.

FIG. 2F depicts a close-up view of the region 269 of the column C0 of FIG. 2E, showing a drain-side select gate SGD0 and a memory cell MC6,0. See also FIG. 3, where this notation is also used. The region shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns.

Figure 4:
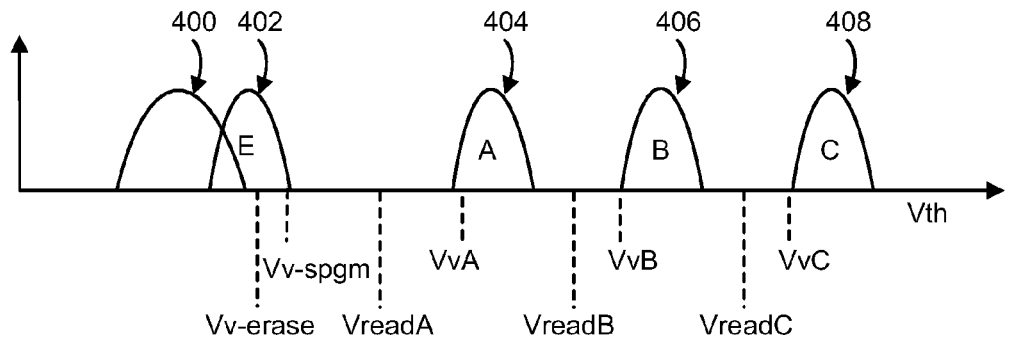
FIG. 4 depicts threshold voltage distributions of an erased state and higher data states.

When a memory cell is programmed, electrons are stored in a portion of the charge trapping layer which is associated with the memory cell. For example, electrons are represented by "–" symbols in the charge trapping layer 297 for MC6,0. These electrons are drawn into the charge trapping layer from the polysilicon body, and through the tunnel oxide. The threshold voltage of a memory cell is increased in proportion to the amount of stored charge. During an erase operation, a voltage in the polysilicon body is raised due to GIDL, as mentioned, while a voltage of one or more selected word line layers floats. The voltage of the one or more selected word line layers is then driven down sharply to a low level such as 0 V to create an electric field across the tunnel oxide which causes holes to be injected from the memory cell's body to the charge trapping layer, resulting in a large Vth downshift toward an erase-verify level, Vv-erase (FIG. 4). This process can be repeated in successive iterations until an erase-verify condition is met, as discussed further in connection with FIG. 5A.

For unselected word lines, the word lines are floated but not driven down to a low level so that the electric field across the tunnel oxide is relatively small, and no, or very little, hole tunneling will occur. Memory cells of the unselected word lines will experience little or no Vth downshift, and as a result, they will not be erased.

FIG. 2G depicts a cross-sectional view of the column C0 of FIG. 2F. Each layer is ring-shaped in one possible approach, except the core filler which is cylindrical.

FIG. 3 depicts an arrangement of memory cells in an example set of NAND strings such as SetA0 in FIG. 2E. NAND strings NSA0 to NSA5 and their columns of memory cells are depicted. For convenience, a notation is used in which SGD denotes a drain-side select gate of a NAND string, e.g., the select gate at the top of the drain-side column of a U-shaped NAND string. Each SGD is numbered, starting from 0 and proceeding left to right across the figures, e.g., from SGD0 to SGD5. SGS denotes a source-side select gate of a NAND string, e.g., the select gate at the top of the source-side column of a U-shaped NAND string. Each SGS is also numbered, starting from 0 and proceeding left to right across the figures, e.g., from SGS0 to SGS5.

Each memory cell is numbered in a (z,y) format where z denotes a word line layer of the memory cell and y denotes the position of the memory cell in the word line layer. For example, memory cells connected to WL0, WL1, WL2, WL3, WL4, WL5 and WL6 are numbered as MC0,0 to MC0,11, MC1,0 to MC1,11, MC2,0 to MC2,11, MC3,0 to MC3,11, MC4,0 to MC4,11, MC5,0 to MC5,11, and MC6,0 to MC6, 11, respectively, proceeding left to right across the figures. WL0, WL1, WL2, WL3, WL4, WL5 and WL6 denote word line layer portions at a given level or height in the stack.

Additionally, a heavy dashed line border of a memory cell indicates a selected memory cell which has been selected in an erase operation. A lighter dashed line border of a memory cell indicates an unselected memory cell which has not been selected in an erase operation, such as a non-erased memory cell which is eligible to store user data, or a dummy memory cell which is not eligible to store user data. A dummy memory cell can be programmed to any data state, for instance, and is not considered to be eligible to store useful information such as user data or system data. Dummy memory cells can be set aside by the control circuitry and not used to store user data.

Recall that each word line layer can have two, inter-digitated word line layer portions as set forth in FIG. 2A. In one approach, only the memory cells of one of the word line layer portions are selected to be erased. In another approach, as shown here, the memory cells of both of the word line layer portions in a block are selected to be erased. For example, all of the memory cells associated with WL3, namely MC3,0 to MC3,11, are selected to be erased in an erase operation. The memory cells of WL0 to WL2 and WL4 to WL6 are unselected memory cells which are not selected to be erased in the erase operation. Generally, an erase operation can involve one or more word line layers, one or more word line layer portions in a word line layer, and all, or fewer than all, memory cells in a selected word line layer or portion. In the simplest case, all memory cells in a block are selected to be erased.

FIG. 4 depicts threshold voltage distributions of an erased state and higher data states. As mentioned, memory cells can be programmed so that their threshold voltages are in respective ranges which represent data states. Initially, an erase operation is performed which places all of the memory cells in the erased state (E). Subsequently, some of the memory cells can be programmed to a higher threshold voltage such as to represent the A, B or C data states.

The x-axis indicates a threshold voltage and the y-axis indicates a number of storage elements. In this example, there are four data states (each represented by a threshold voltage distribution): an initial erased state 400, a soft programmed erased state (E) 402, an A state 404, a B state 406 and a C state 408. Memory devices with additional data states, e.g., eight or sixteen data states, can also be used. The distribution 400 is realized after the erase operation when storage elements are typically over-erased, past the erase state 402. In the erase operation, one or more erase pulses are applied to the NAND string at its source and/or drain ends, until the threshold voltage of the storage elements being erased transitions below an erase-verify level, Vv-erase which can be 0 V or close to 0V, in one approach. Once the erase operation is completed for a block, the soft programming operation is performed, in which one or more positive voltage pulses are applied to the control gates of the storage elements, such as via a word line, to increase the threshold voltages of some or all of the storage elements in the distribution 400 closer to and below a soft programming (SPGM) verify level, Vv-spgm, to the erased state 402. For example, a certain, small fraction of the storage elements may be soft programmed to have a Vth above Vv-spgm, at which point the soft programing ends, leaving most of the other storage elements with a Vth which is close to, but below, Vv-spgm. Vv-spgm is typically above or equal to Vv-erase. The soft programming operation advantageously results in a narrow erase state distribution 402. Once the soft programming operation is complete, programming to higher data states can occur, such as to states A, B and C using verify levels VvA, VvB and VvC, respectively. A subsequent read operation can use the levels VreadA, VreadB and VreadC.

Figure 5A:
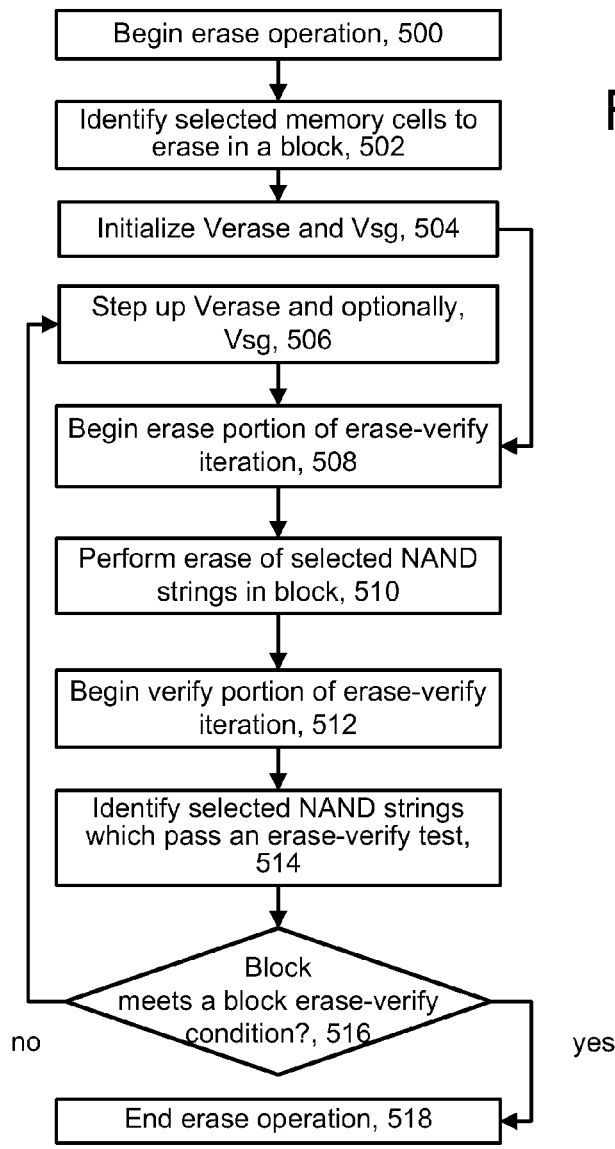
FIG. 5A depicts one embodiment of an erase operation for a block of memory cells.

FIG. 5A depicts one embodiment of an erase operation for a block of memory cells. Generally, unlike a 2D NAND structure, where a p-well substrate is common for all blocks, 3D stacked non-volatile memory devices have an individual thin poly-silicon body for each NAND string channel, whose bias can be controlled by bit line (BL) or source line (SL). In a normal erase operation, referred to as a two-sided erase, gate-induced drain leakage (GIDL) currents are generated at both the SGD and SGS transistors. The BL and SL are biased at Verase, and SGD and SGS are biased at Vsg. In one approach, the two-sided erase continues until a block erase-verify condition is met. In another approach, a one-sided erase is used which continues until a block erase-verify condition is met. In this case, the GIDL current is generated at the bit line side for all the erase pulses of the erase operation. The source line voltage is reduced to Vsg+(0~2V) so that, for all channels, there will be no GIDL current generated at the source line side for all the erase pulses of the erase operation.

In another approach, a two-sided erase is performed initially until one (or more) sets reach a set erase-verify condition, after which only one-sided erases occur. This allows each set of NAND strings to be inhibited to avoid over-erase once the set meets the set erase-verify condition, while allowing erasing to continue for the remaining sets which have not yet met the set erase-verify condition. As the erase-verify iterations occur, the sets will be become inhibited in turn until the erase operation is completed. The set erase-verify condition may be met when at least one selected NAND string in the set has passed the erase-verify test, for instance. In another approach, the set erase-verify condition may be met when at least an integer number or fraction of the selected NAND strings in the set have passed the erase-verify test.

An erase operation begins at step 500. Step 502 identifies selected memory cells to be erased in a block. For example, an entire block can be erased, or memory cells associated with one or more word line layers can be selected to be erased. All, or fewer than all, memory cells in a word line layer or layer portion can be selected to be erased. The identifying steps can be performed by control circuitry, and can involve a determination of one or more selected blocks, memory cells, NAND strings and/or sets of NAND strings. One or more unselected blocks, memory cells, NAND strings and/or sets of NAND strings can similarly be identified by the control circuitry. An erase operation can be initiated by control circuitry of the memory device independently of an external host controller, or in response to an external host controller, for instance. A NAND string which contains a selected memory cell is a selected NAND string.

Figure 5B:
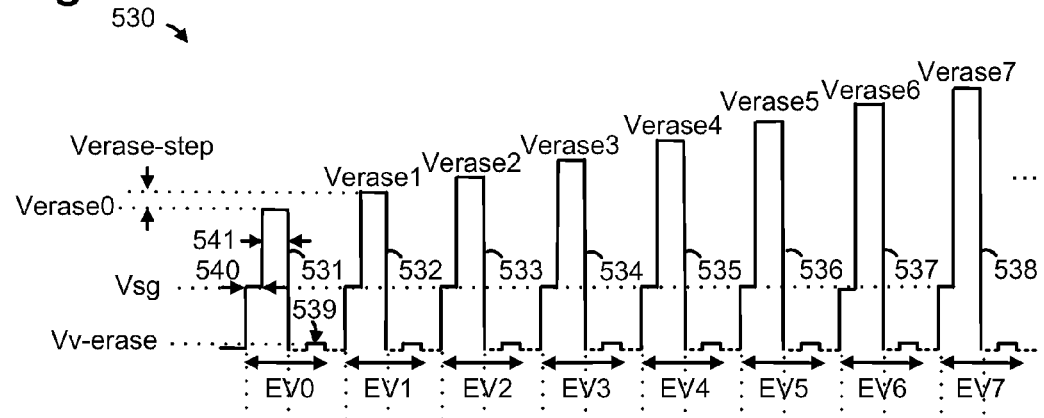
FIG. 5B depicts a series of erase pulses and verify pulses in an erase operation in accordance with steps 510 and 512 of FIG. 5A.

Step 504 initializes the peak value of Verase to a value referred to as Verase0 in FIG. 5B. Vsg can also initialized to a value referred to as Vsg0 in FIG. 5C to 5E. Step 508 begins an erase portion of an erase-verify iteration. At step 510, the erase portion includes performing a two-sided erase of all selected NAND strings in a block, in one approach. For example, these can be NAND strings in SetA0 to SetAn in FIG. 1C, or in SetB0 to SetBn in FIG. 1D. Generally, an erase operation can involve an entire block, or one or more sub-blocks. Step 512 begins the verify portion of the erase-verify iteration. At step 514, the verify portion identifies any (one or more) of the selected NAND strings which pass an erase-verify test. A selected NAND string passes the erase-verify test when sensing circuitry determines that the string is conductive, when Vv-erase is applied to the control gates of the selected memory cells of the string. A selected NAND string which passes the erase-verify test is now considered to be an unselected or inhibited NAND string.

Decision step 516 determines if the block meets a block erase-verify condition. In one approach, the block erase-verify condition is met when no more than an integer number or fraction N of the selected NAND strings have not passed the erase-verify test. For example, with 192k selected NAND strings in a block, it is possible to end the erase operation before all NAND strings have passed the erase-verify test. For instance, N can be about 1-10% of the number of NAND strings in a block (e.g., 1-10% of 192k). The higher N is set, the sooner the erase operation can be completed, so that the highest amplitude value of Verase which is used is reduced, compared to the case where N=0. Even though some NAND strings have not passed the erase-verify test when the erase operation ends, the associated selected memory cells are likely very close to passing the test, and can be successfully soft-programmed.

Figure 5C:
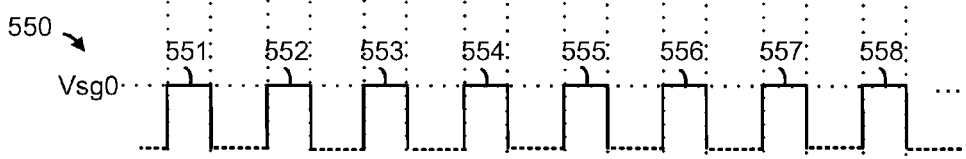
FIG. 5C depicts a series of SGS or SGD select gate voltages for a selected sub-block in an erase operation in accordance with one embodiment of step 510 of FIG. 5A, where a level of the select gate voltages is fixed at Vsg0.
Figure 5D:
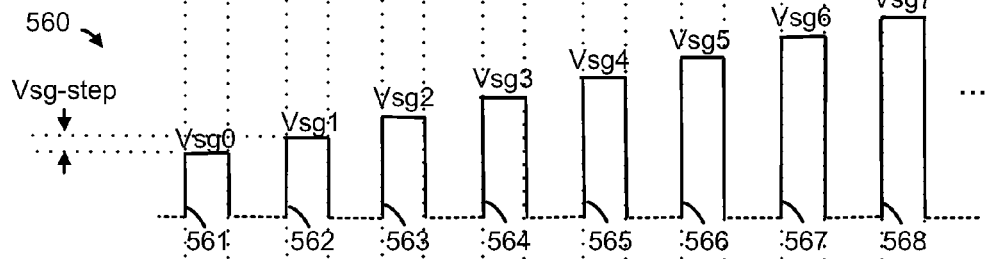
FIG. 5D depicts a series of SGS or SGD select gate voltages for a selected sub-block in an erase operation in accordance with one embodiment of step 510 of FIG. 5A, where a level of the select gate voltages steps up for each erase-verify iteration.
Figure 5E:
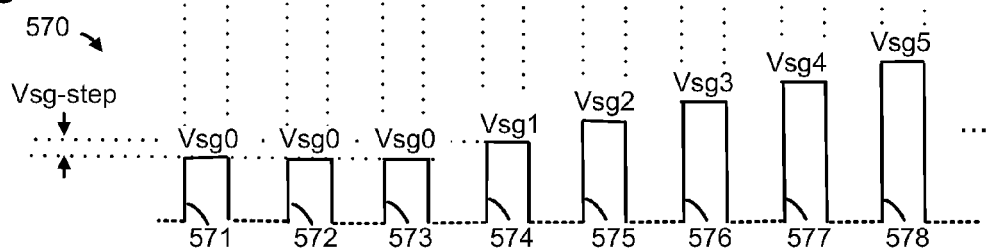
FIG. 5E depicts a series of SGS or SGD select gate voltages for a selected sub-block in an erase operation in accordance with one embodiment of step 510 of FIG. 5A, where a level of the select gate voltages steps up for each iteration after a predetermined or adaptively determined number of erase-verify iterations.

If decision step 516 is true, the erase operation ends at step 518. If decision step 516 is false, step 506 is reached. At step 506, Verase and optionally, Vsg are stepped up for the next erase-verify iteration. FIG. 5B depicts Verase being stepped up, and FIGS. 5D and 5E depicts Vsg being stepped up. FIG. 5C depicts Vsg at a fixed level of Vsg0. Step 510 begins the erase portion of the next erase-verify iteration. Step 512 begins the verify portion of the erase-verify iteration.

FIG. 5B depicts a series 530 of erase pulses and verify pulses in an erase operation in accordance with steps 510 and 512 of FIG. 5A. The erase pulses and verify pulses are presented together for understanding although they are applied to different portions of the memory device (the bit/source lines and control gates, respectively). An erase operation can include multiple erase-verify iterations, e.g., EV0 to EV7. Each erase-verify iteration can include an erase portion/pulse followed by a verify portion. Examples erase portions 531-538 are provided for erase-verify iterations EV0-EV7, respectively. Example verify portion 539 having an amplitude of Vv-erase follows erase portion 531. In the erase portion, an erase pulse or voltage is applied to one or both ends of a NAND string. Each erase portion can have a first portion which is applied in a preparation phase, and a second portion which is applied in charge up and erase phases, as discussed further below. For example, erase portion 531 has a first portion 540 and a second portion 541. In this example, the first portion of each erase portion has an amplitude of Vsg (an initial lower level), and the second portions of the erase portions have amplitudes (subsequent peak levels) of Verase0 to Verase7, which increase according to a step size of Verase-step.

The erase pulses can thus step up in amplitude in each iteration, in one approach, by Verase-step. Verase-step can be fixed or varying in an erase operation. In the verify portion, a determination is made as to whether the Vth of a selected memory cell which is to be erased has fallen below Vv-erase. This can include determining whether the selected memory cell is in a conductive state when a word line voltage of Vv-erase is applied to the selected memory cell. If the selected memory cell is in a conductive state, Vth<Vv-erase and the selected memory cell has been erased. If the selected memory cell is in a non-conductive state, Vth>Vv-erase and the selected memory cell has not yet been erased.

FIG. 5C depicts a series 550 of SGS or SGD select gate voltages for a selected sub-block in an erase operation in accordance with one embodiment of step 510 of FIG. 5A, where a level of the select gate voltages is fixed at Vsg0. The example select gate voltages 551-558 are each set to Vsg0 and are applied during each of the erase pulses 531-538, respectively.

FIG. 5D depicts a series 560 of SGS or SGD select gate voltages for a selected sub-block in an erase operation in accordance with one embodiment of step 510 of FIG. 5A, where a level of the select gate voltages steps up for each erase-verify iteration. For example, the select gate voltages 561-568 are Vsg0-Vsg7, respectively. In one approach, the step size Vsg-step is the same as Verase-step, so that the drain-to-gate voltage of the select gate is constant in the different erase-verify iterations. By stepping up the select gate voltage with the erase voltage, increasingly higher drain-to-gate voltage differences across the select gates are avoided, so that their degradation is reduced.

FIG. 5E depicts a series 570 of SGS or SGD select gate voltages for a selected sub-block in an erase operation in accordance with one embodiment of step 510 of FIG. 5A, where a level of the select gate voltages steps up for each iteration after a predetermined or adaptively determined number of erase-verify iterations. In this example, the select gate voltages 571-573 are at Vsg0, and the select gate voltages 574-578 are at stepped up levels Vsg1-Vsg5, respectively, according to the step size Vsg-step.

Figure 5F:
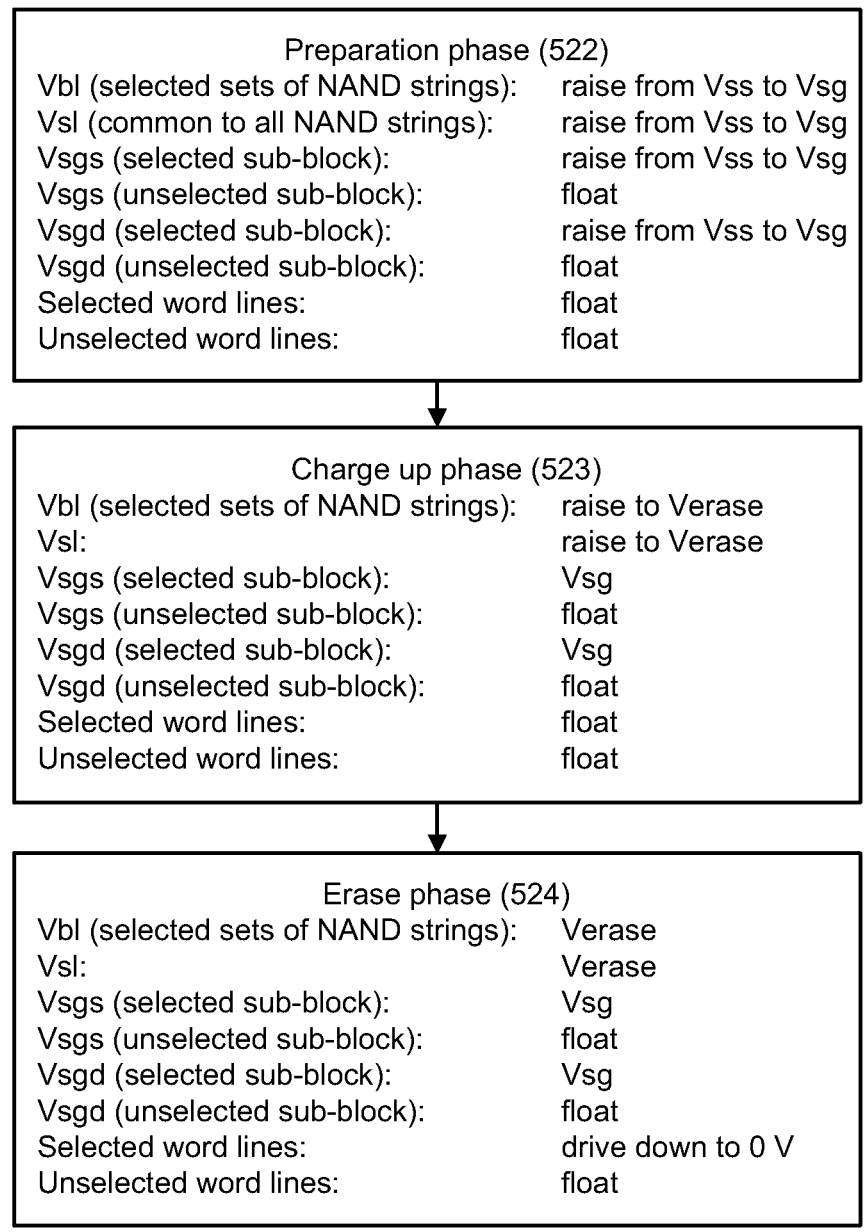
FIG. 5F depicts details of step 510 of FIG. 5A when a two-sided erase is used.

FIG. 5F depicts details of step 510 of FIG. 5A when a two-sided erase is used. Step 506 provides the erase portion in a two-sided erase of all sets of NAND strings in a block. An erase operation can include three phases, discussed further in connection with FIGS. 6A to 6H: a preparation phase (step 522), a charge up phase (step 523) and an erase phase (step 524). The preparation phase (PP) corresponds to the time interval t0-t3 in FIGS. 6A to 6H. At step 522, the preparation phase sets voltages as follows: Vbl (selected sets of NAND strings): raise from Vss to Vsg (waveform 624-627 in FIG. 6A or 620-623 in FIG. 6F); Vsl (common to all NAND strings in a block): raise from Vss to Vsg (waveform 624-627 in FIG. 6A or 620-623 in FIG. 6F); Vsgs (selected sub-block): raise from Vss to Vsg (waveform 606 in FIG. 6B or 640-643 in FIG. 6H); Vsgs (unselected sub-block): float (waveform 604); Vsgd (selected sub-block): raise from Vss to Vsg (waveform 606 in FIG. 6B or 640-643 in FIG. 6H); Vsgd (unselected sub-block): float (waveform 604); Selected word lines: float (waveform 614); and unselected word lines: float (waveform 616). If all NAND strings in the block are selected to be erased, there will be no inhibited NAND strings during the two-sided erase, in one approach.

A selected sub-block is a sub-block with one or more selected NAND strings, and an unselected sub-block is a sub-block with all unselected NAND strings.

A long-dash line represents a floating voltage in FIGS. 6A-6H, while a solid or short-dash line represents a driven voltage.

The charge up phase (CUP) corresponds to the time interval t3-t6 in FIGS. 6A to 6H. At step 523, the charge up phase sets voltages as follows: Vbl (selected sets of NAND strings): raise to Verase (waveforms 624-627 in FIG. 6A or 620-623 in FIG. 6F); Vsl: raise to Verase (waveforms 624-627 in FIG. 6A or 620-623 in FIG. 6F); Vsgs (selected sub-block): Vsg (waveforms 606 in FIG. 6B or 640-643 in FIG. 6H); Vsgs (unselected sub-block): float (waveform 604); Vsgd (selected sub-block): Vsg (waveforms 606 in FIG. 6B or 640-643 in FIG. 6H); Vsgd (unselected sub-block): float (waveform 604); Selected word lines: float (waveform 614); and unselected word lines: float (waveform 616).

The erase phase (EP) corresponds to the time interval t6-t9 in FIGS. 6A to 6H. At step 524, the erase phase sets voltages as follows: Vbl (selected sets of NAND strings): Verase (waveforms 624-627 in FIG. 6A or 620-623 in FIG. 6F); Vsl: Verase (waveforms 624-627 in FIG. 6A or 620-623 in FIG. 6F); Vsgs (selected sub-block): Vsg (waveforms 606 in FIG. 6B or 640-643 in FIG. 6H); Vsgs (unselected sub-block): float (waveform 604); Vsgd (selected sub-block): Vsg (waveforms 606 in FIG. 6B or 640-643 in FIG. 6H); Vsgd (unselected sub-block): float (waveform 604); Selected word lines: drive down to 0 V (waveform 614); and unselected word lines: float (waveform 616).

Vsgs is the source-side select gate voltage and Vsgd is the drain-side select gate voltage.

For example, Vsg can be about 5-15 V and Verase can be about 15-25 V. In the preparation phase, if Vsl is roughly equal to Vsgs, essentially no GIDL will be generated from the SGS transistor. Vsl would need to exceed Vsgs by a sufficient margin such as several Volts, e.g., at least about 4-6 V, in order to generate GIDL from the SGS transistor. Similarly, since Vbl roughly equals Vsgd, essentially no GIDL will be generated from the SGD transistor. Vbl would need to exceed Vsgd by a substantial margin to generate GIDL from the SGD transistor.

Specifically, GIDL current at a select gate is determined by the bias difference (Vdg=Vd−Vg), between the drain voltage (Vd) and the gate voltage (Vg) of the select gate. The GIDL current density can be modeled by: $J=A*Es*exp(-B/Es)$, where Es is the transverse electric field at the surface, and $Es=(Vdg+C)/Tox$. Thus, $J=A'*(Vdg+C)*exp(-B'/(Vdg+C))$, where A', B' and C are constants determined by some physical parameters. Normally, Vdg>>Vth of the select gate to obtain a considerable GIDL current. In one configuration, Vdg>4-6 V or 4-8 V is needed for erase pulse width of about one msec. When Vdg is small, GIDL is negligible and is not able to charge-up the inhibited channel to cause erase. GIDL can be on the order of $10^{-11}$ or $10^{-12}$ amps. Although raising Vsg such as described in FIGS. 5D and 5E can reduce GIDL, this may slow down the charge up process by only a small amount. The final Vbody is determined by Verase, so this will not change if Vsg changes.

Vbody (waveform 608 in FIG. 6C) denotes a potential of the body of the selected NAND string, e.g., the polysilicon body. The body is quickly charged up to an initial level in the preparation phase. A higher level of GIDL is generated in the charge up phase, and the body is charged-up to a higher level. For an unselected NAND string, Vbody is not charged up as much and may be between about 0 V and the initial level for the selected NAND strings. It is difficult to describe the body potential of the entire body using a single value due to the floating of the word lines. The body can be thought of as an electron pool, such that when Vsg+1 V is applied on both the bit line and source line, and Vsg is applied to SGS and SGD select gates, electrons start to flow to the bit line and source line so that the body potential increases. However, the electrons are quickly exhausted as there is no more electron supply in the body, so that the body potential will not increase further. This is different from the body of the selected NAND strings in the charge-up stage, where GIDL-generated holes flood into the channel and raise the whole body potential.

Vth (waveform 612 in FIG. 6D) is the threshold voltage of a selected memory cell. It is at some non-zero level, e.g., above 0 V, perhaps 1-6 V, in the A, B or C state. Vwl-selected (waveform 614 in FIG. 6E) is the voltage of a selected word line (e.g., word line layer or portion) which is in communication with one or more selected memory cells to be erased. Vwl-unselected (waveform 616 in FIG. 6E) is the voltage of an unselected word line (e.g., word line layer or portion) which is in communication with one or more unselected memory cells, to be inhibited from being erased.

Figure 6A:
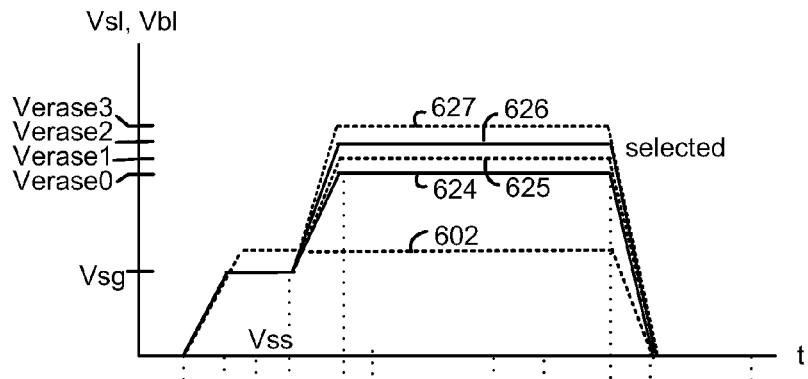
FIGS. 6A-6H depict voltages in the erase portion of an erase-verify iteration of an erase operation.
Figure 6B:
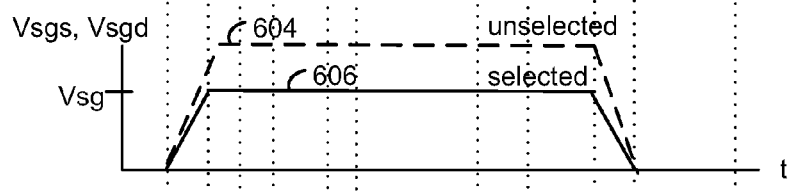
Figure 6C:
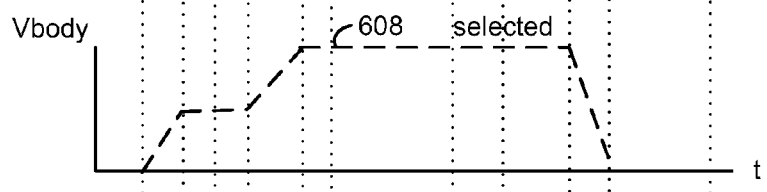
Figure 6D:
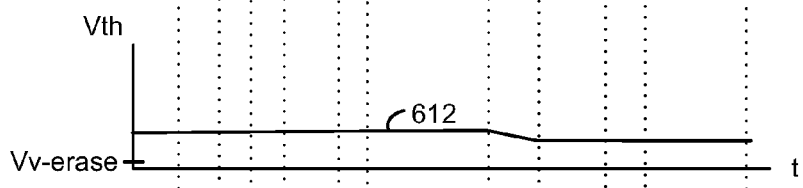
Figure 6E:
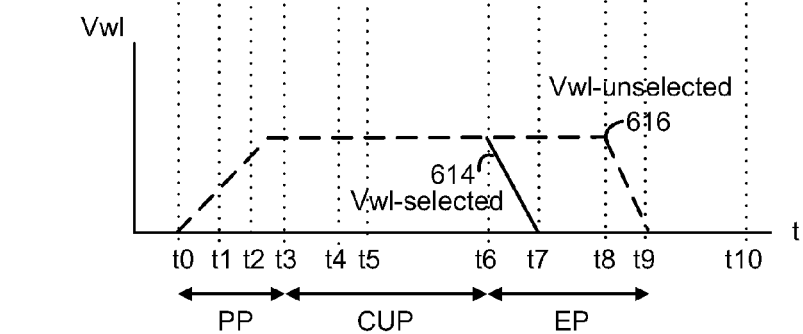
Figure 6F:
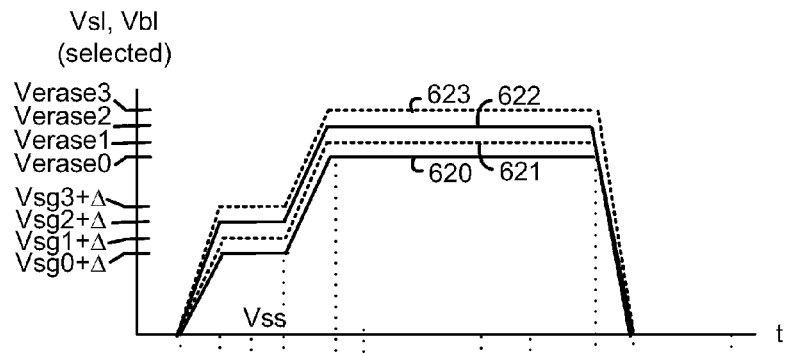

In the charge up phase, for the two-sided erase, Vsl and Vbl are stepped up to Verase from t3-t8 (waveforms 624-627 in FIG. 6A or 620-623 in FIG. 6F). As a result, Vdg (the drain-to-gate voltage of the SGD or SGS select gates) is increased high enough so that GIDL is generated at the SGS and SGD select gates, charging up the body (Vbody). Verase is considered to be an erase voltage—it is sufficiently higher than Vsg to cause a significant amount of GIDL to charge up the body by a desired amount in a desired amount of time. In practice, as mentioned, Verase can exceed Vsg by at least about 4-6 V and perhaps about 10-15 V. Verase can range from about 15-25 V, as mentioned.

Vbody can be of a similar magnitude as Verase, perhaps 0-2 V lower. The rise in Vbody is coupled to the floating word lines so that Vwl-selected and Vwl-unselected rise up with Vbody. Vwl-selected and Vwl-unselected can be of a similar magnitude as Vbody, perhaps slightly lower.

In the erase phase, Vwl-selected is driven to a low level such as 0 V at t6-t7 to add holes into the charge trapping layer, lowering the Vth of the selected memory cells, as indicated by waveform 612. Vwl-unselected continues to float so that holes are not added to the charge trapping layer for unselected memory cells.

Figure 5G:
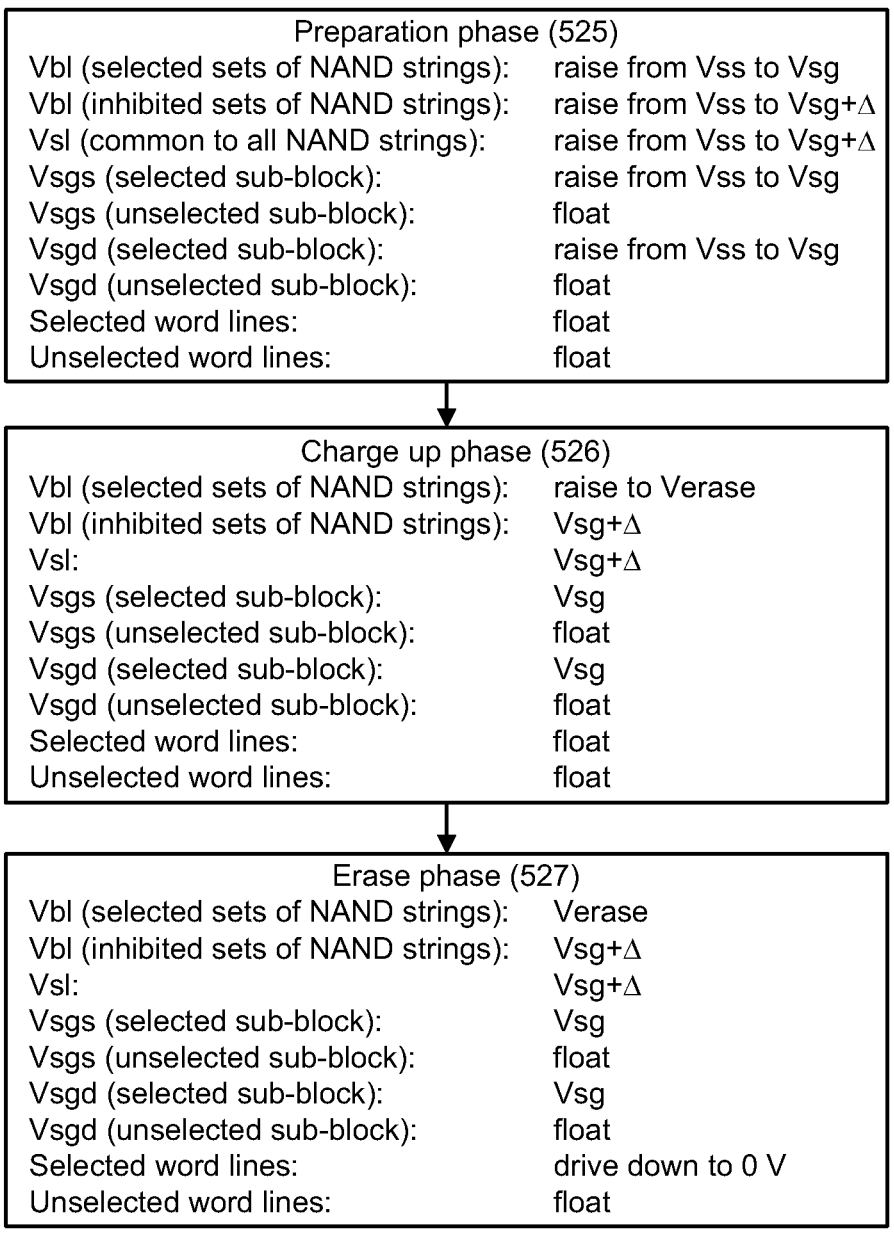
FIG. 5G depicts details of step 510 of FIG. 5A when a one-sided erase is used.

FIG. 5G depicts details of step 510 of FIG. 5A when a one-sided erase is used. At step 525, the preparation phase sets voltages as follows: Vbl (selected sets of NAND strings): raise from Vss to Vsg (waveforms 624-627 in FIG. 6A or 620-623 in FIG. 6F); Vbl (inhibited sets of NAND strings): raise from Vss to Vsg+Δ; Vsl (common to all NAND strings): Vsg+Δ (waveforms 602 in FIG. 6A or 630-633 in FIG. 6G); Vsgs (selected sub-block): Vsg (waveforms 606 in FIG. 6B or 640-643 in FIG. 6H); Vsgs (unselected sub-block): float (waveform 604); Vsgd (selected sub-block): raise from Vss to Vsg (waveforms 606 in FIG. 6B or 640-643 in FIG. 6H); Vsgd (unselected sub-block): float (waveform 604); selected word lines: float (waveform 614); and unselected word lines: float (waveform 616).

At step 526, the charge up phase sets voltages as follows: Vbl (selected sets of NAND strings): raise to Verase (waveforms 624-627 in FIG. 6A or 620-623 in FIG. 6F); Vbl (inhibited sets of NAND strings): Vsg+Δ; Vsl: Vsg+Δ (waveforms 602 in FIG. 6A or 630-633 in FIG. 6G); Vsgs (selected sub-block): Vsg (waveforms 606 in FIG. 6B or 640-643 in FIG. 6H); Vsgs (unselected sub-block): float (waveform 604); Vsgd (selected sub-block): Vsg (waveforms 606 in FIG. 6B or 640-643 in FIG. 6H); Vsgd (unselected sub-block): float (waveform 604); selected word lines: float (waveform 614); and unselected word lines: float (waveform 616).

At step 527, the erase phase sets voltages as follows: Vbl (selected sets of NAND strings): Verase (waveforms 624-627 in FIG. 6A or 620-623 in FIG. 6F); Vbl (inhibited sets of NAND strings): Vsg+Δ; Vsl: Vsg+Δ (waveforms 602 in FIG. 6A or 630-633 in FIG. 6G); Vsgs (selected sub-block): Vsg (waveforms 606 in FIG. 6B or 640-643 in FIG. 6H); Vsgs (unselected sub-block): float (waveform 604); Vsgd (selected sub-block): Vsg (waveforms 606 in FIG. 6B or 640-643 in FIG. 6H); Vsgd (unselected sub-block): float (waveform 604); selected word lines: drive down to 0 V (waveform 614); and unselected word lines: float (waveform 616).

Figure 6G:
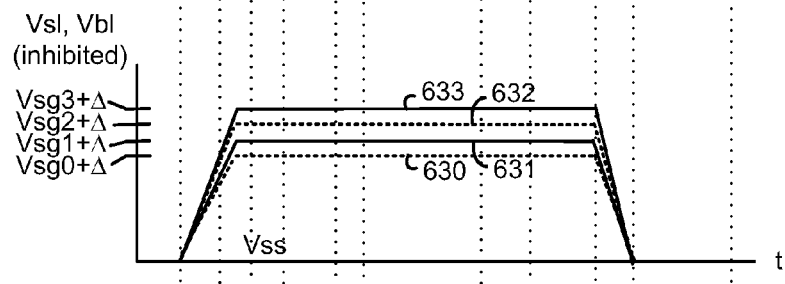

During the one-sided erase, Vsl is biased at Vsg+Δ, as indicated by waveforms 602 in FIG. 6A or 630-633 in FIG. 6G.

Since the GIDL is generated only at the drain end of the selected NAND strings in the one-sided erase, Vbody may charge up slightly slower compared to when GIDL is generated at both the drain and source ends of the selected NAND strings, but this does not significantly impair the erase operation.

FIGS. 6A-6H depict voltages in the erase portion of an erase-verify iteration of an erase operation. FIGS. 6A to 6H have a common time axis but the time increments are not necessarily equally spaced and the figures are not necessarily to scale.

FIG. 6A depicts one embodiment of Vsl and Vbl for selected and inhibited NAND strings during the erase portion of an erase-verify iteration. Four example waveforms 624-627 correspond to erase pulses 531-534, respectively, in FIG. 5B and to select gate voltages 551-554, respectively in FIG. 5C. The waveforms 624-627 can have peak amplitudes of Verase0-Verase3, respectively, where the amplitudes are incremented by Verase-step. Additional erase pulses, if used, are not depicted. In each erase pulse, the lower initial amplitude in the preparation phase is the same (Vsg) but the peak amplitude in the charge up and erase phases is stepped up by Verase-step in each successive erase-verify iteration. Vsl and Vbl are ramped up to their peak level in two steps to avoid damaging the SGS and SGD select gates, respectively.

FIG. 6B depicts one embodiment of Vsgs and Vsgd for selected and unselected sub-blocks (waveforms 606 and 604, respectively) during the erase portion of an erase-verify iteration.

FIG. 6C depicts Vbody for selected NAND strings (waveform 608) during the erase portion of an erase-verify iteration.

FIG. 6D depicts Vth for a selected memory cell (waveform 612) during the erase portion of an erase-verify iteration.

FIG. 6E depicts Vwl for selected and unselected word lines (waveforms 614 and 616, respectively) during the erase portion of an erase-verify iteration.

FIG. 6F depicts another embodiment of Vsl and Vbl for selected NAND strings during the erase portion of an erase-verify iteration. Four example waveforms 620-623 correspond to erase pulses 531-534, respectively, in FIG. 5B and to select gate voltages 561-564, respectively in FIG. 5D. Additional erase pulses, if used, are not depicted. In each erase pulse, the lower initial amplitude in the preparation phase is the same (Vsg) but the peak amplitude in the charge up and erase phases is stepped up by Verase-step in each successive erase-verify iteration. The waveforms 620-623 can have initial amplitudes of Vsg0+Δ to Vsg3+Δ, respectively, where the amplitudes are incremented by Vsg-step. The waveforms 620-623 can have peak amplitudes of Verase0 to Verase3, respectively, where the amplitudes are incremented by Verase-step.

FIG. 6G depicts another embodiment of Vsl and Vbl for inhibited NAND strings during the erase portion of an erase-verify iteration. Four example SGS and SGD waveforms 630-633 correspond to the erase waveforms 620-623 of FIG. 6F and have amplitudes of Vsg0+Δ to Vsg3+Δ, respectively, where the amplitudes are incremented by Vsg-step. Additional waveform pulses, if used, are not depicted. The level of each waveform exceeds the level of the corresponding erase pulse waveform in the preparation phase by a common margin Δ such as 0-2 V. As mentioned further below, various advantages are achieved.

Figure 6H:
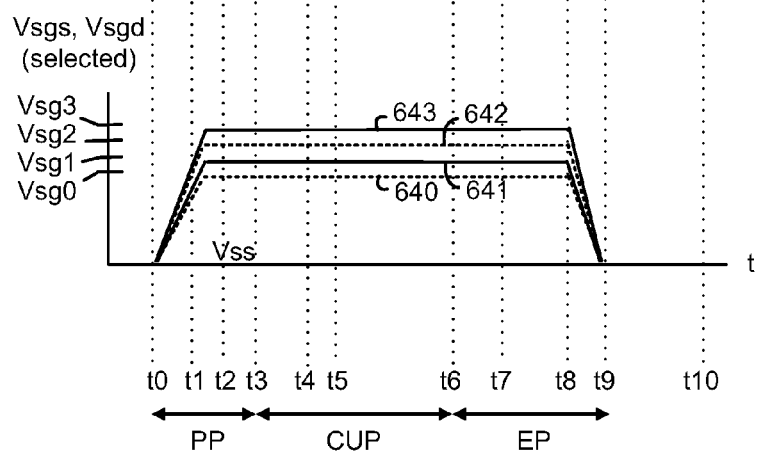

FIG. 6H depicts another embodiment Vsgs and Vsgd for selected sub-blocks during the erase portion of an erase-verify iteration. Four example SGS and SGD waveforms 640-643 correspond to the erase waveforms 620-623 of FIG. 6F and have amplitudes of Vsg0 to Vsg3, respectively, where the amplitudes are incremented by Vsg-step. Additional waveform pulses, if used, are not depicted. Each waveform is less than the value of the corresponding erase pulse waveform for inhibited sets of bit lines and the source line in the preparation phase by a common margin Δ such as 0-2 V. As mentioned further below, various advantages are achieved. Each amplitude of Vsg could be shifted based on a measure of degradation such as the number of program-erase cycles (e.g., use a higher Vsg for a higher number of program-erase cycles).

Figure 7A:
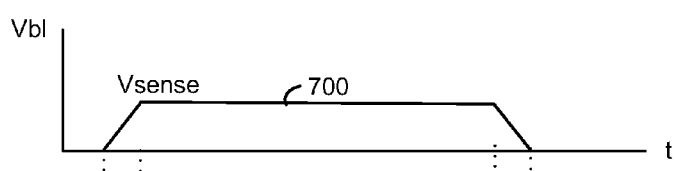
FIGS. 7A-7C depict voltages in the verify portion of an erase-verify iteration of an erase operation.
Figure 7B:
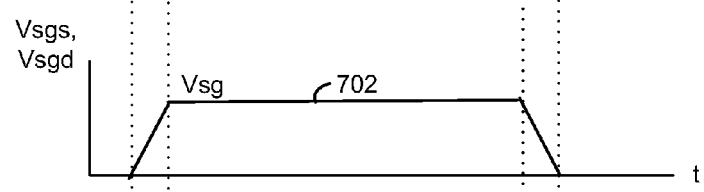
Figure 7C:
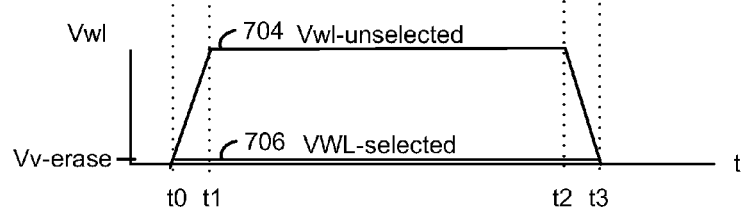

FIGS. 7A-7C depict voltages in the verify portion of an erase-verify iteration of an erase operation. FIG. 7A depicts Vbl (waveform 700) during the verify portion of an erase-verify iteration. FIG. 7B depicts Vbsgs and Vsgd (waveform 702) during the verify portion of an erase-verify iteration. FIG. 7C depicts Vwl for selected and unselected word lines (waveforms 706 and 704, respectively) during the verify portion of an erase-verify iteration.

During the verify portion, the selected sets of NAND strings are sensed using sensing circuitry to determine whether the threshold voltages of the selected memory cells have passed the erase-verify test. During the sensing, Vbl is set to a sense voltage, Vsense (waveform 700 in FIG. 7A). Vsgs and Vsgd (waveform 702 in FIG. 7B) are set to a level such as Vsg which renders them conductive. Vsgs and Vsgd can be set to the same or different levels. Vwl-unselected (waveform 704 in FIG. 7C) is set to a sufficiently high level, e.g., 8 V, to render the unselected memory cells in a conductive state. Vwl-selected (waveform 706 in FIG. 7C) is set to Vv-erase. Sensing circuitry connected to a NAND string senses whether the NAND string is in a conductive state, which indicates the selected memory cells of the NAND string have been erased and therefore pass the erase-verify test.

In one approach, the verify portion involves performing the erase-verify test for the selected NAND strings in one sub-block at a time. For example, in FIG. 2A, the NAND strings in sub-block 201 can be verified. Typically, each NAND string is verified separately from other NAND strings and the verifying occurs concurrently for the different NAND strings in a sub-block. Next, the NAND strings in sub-block 202 are verified. The NAND strings in each sub-block are verified until the NAND strings in sub-block 206 have been verified, at which time the block has been verified and the very portion of the erase-verify iteration has ended.

FIGS. 7A to 7C have a common time axis (different than the time axis of FIGS. 6A to 6H) but the time increments are not necessarily equally spaced and the figures are not necessarily to scale.

Figure 8A:
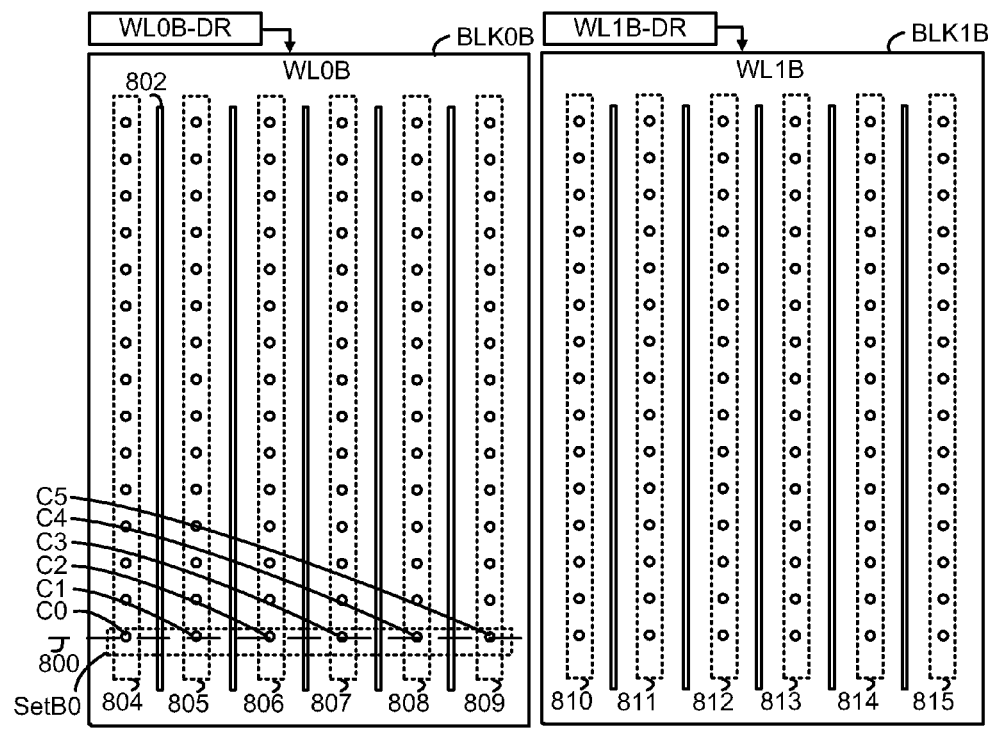
FIG. 8A depicts a top view of word line layers of a 3D non-volatile memory device having straight NAND strings, consistent with FIG. 1D, showing associated drivers.

FIG. 8A depicts a top view of word line layers of a 3D non-volatile memory device having straight NAND strings, consistent with FIG. 1D, showing associated drivers. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, BLK0B has word line layer WL0B, driven by WL0B-DR, and BLK1B has word line layer WL1B, driven by WLB1-DR. A number of slits, such as example slit 802, can also be used. These insulation-filled slits are used in the fabrication process to provide structural support for the stack when undoped polysilicon layers are removed by a wet etch and a dielectric is deposited to form the alternating dielectric layers.

Figure 8B:
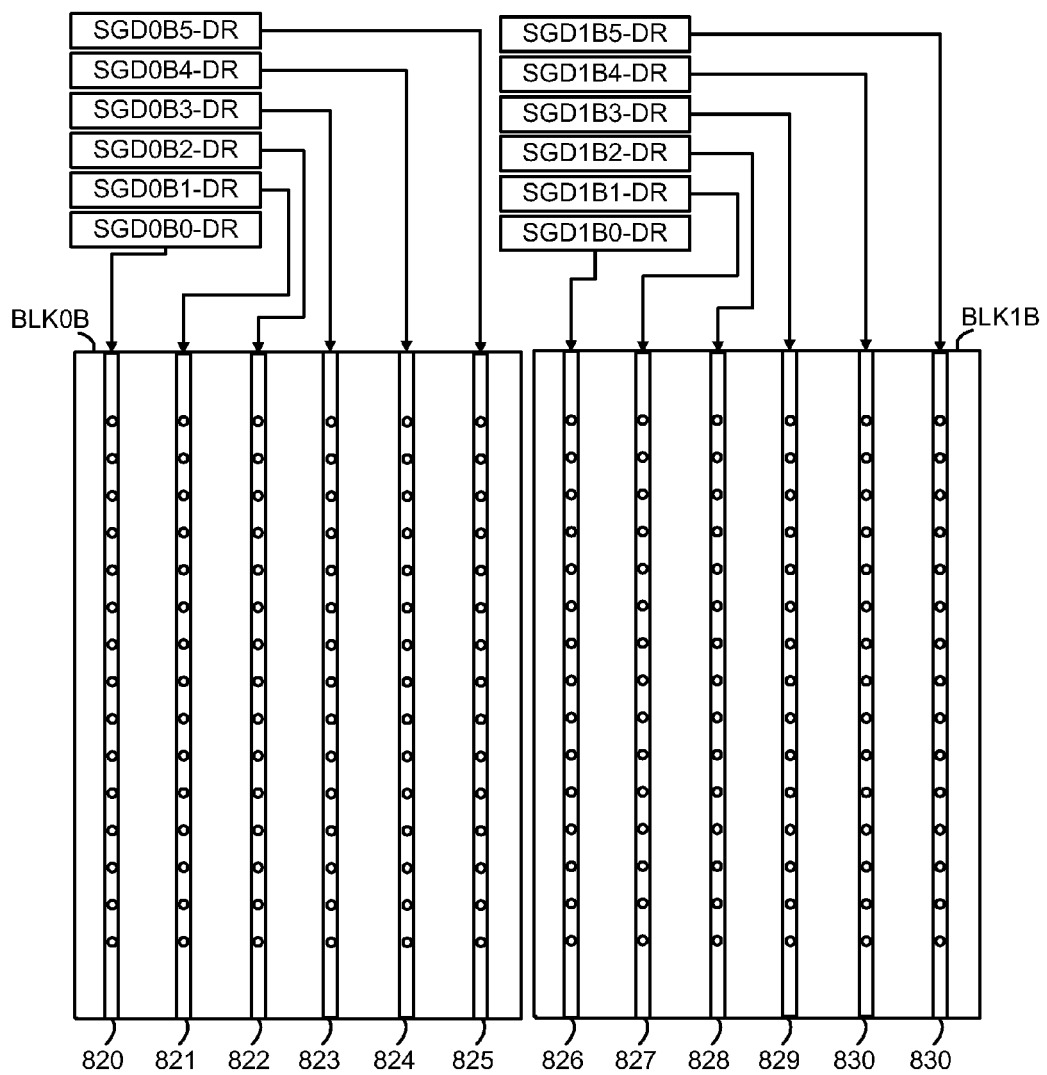
FIG. 8B depicts a top view of a select gate layer of the 3D non-volatile memory device of FIG. 8A, showing drain-side select gate lines and associated drivers.
Figure 8C:
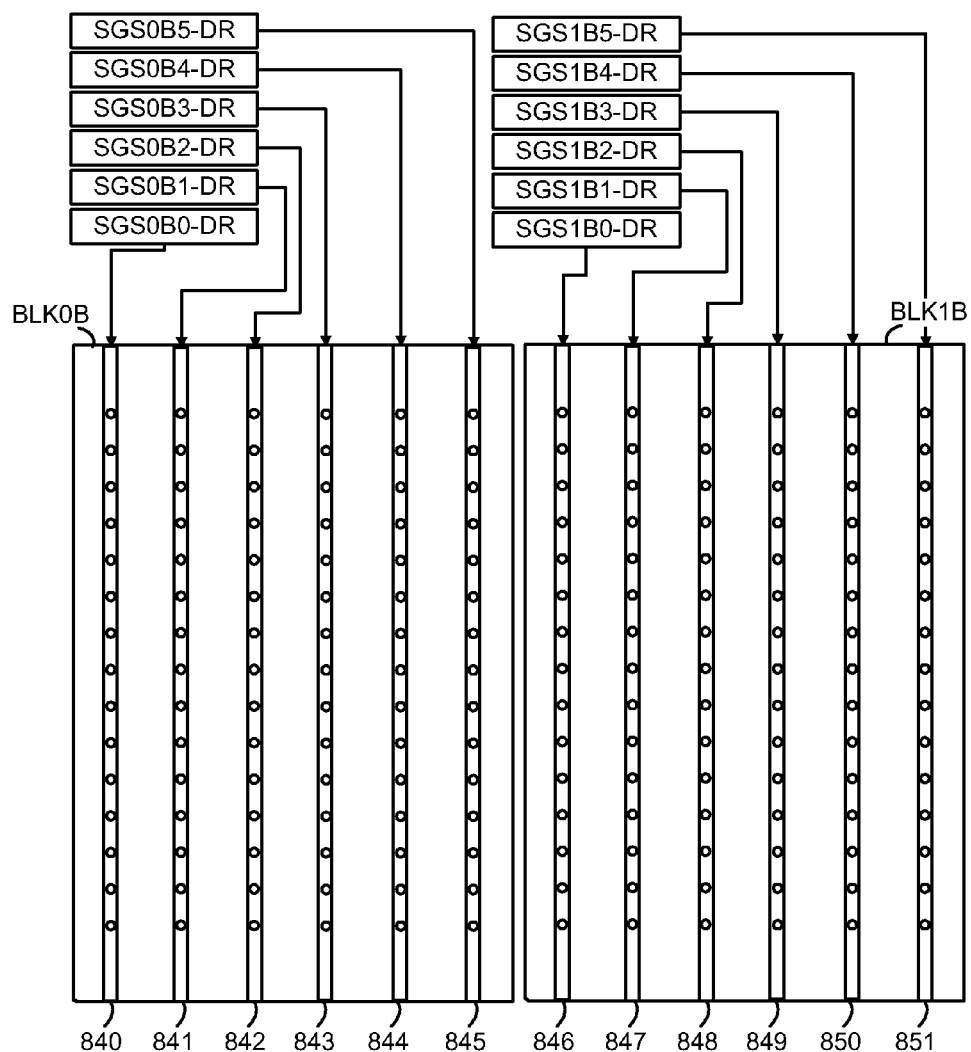
FIG. 8C depicts a top view of a select gate layer of the 3D non-volatile memory device of FIG. 8A, showing source-side select gate lines and associated drivers.
Figure 8D:
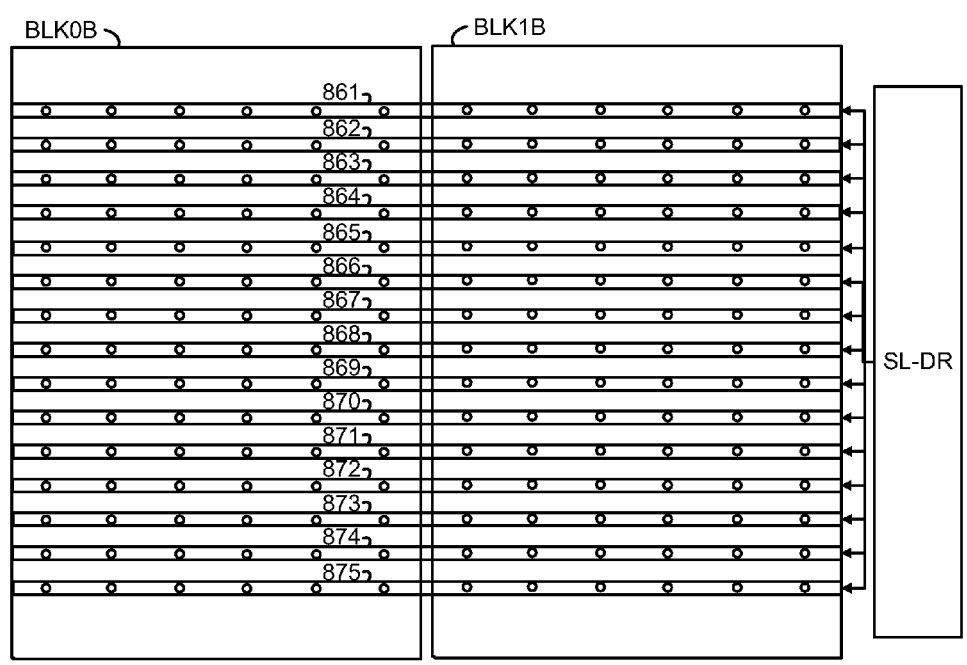
FIG. 8D depicts a top view of a source line layer of the 3D non-volatile memory device of FIG. 8A, showing source lines and associated drivers.
Figure 8E:
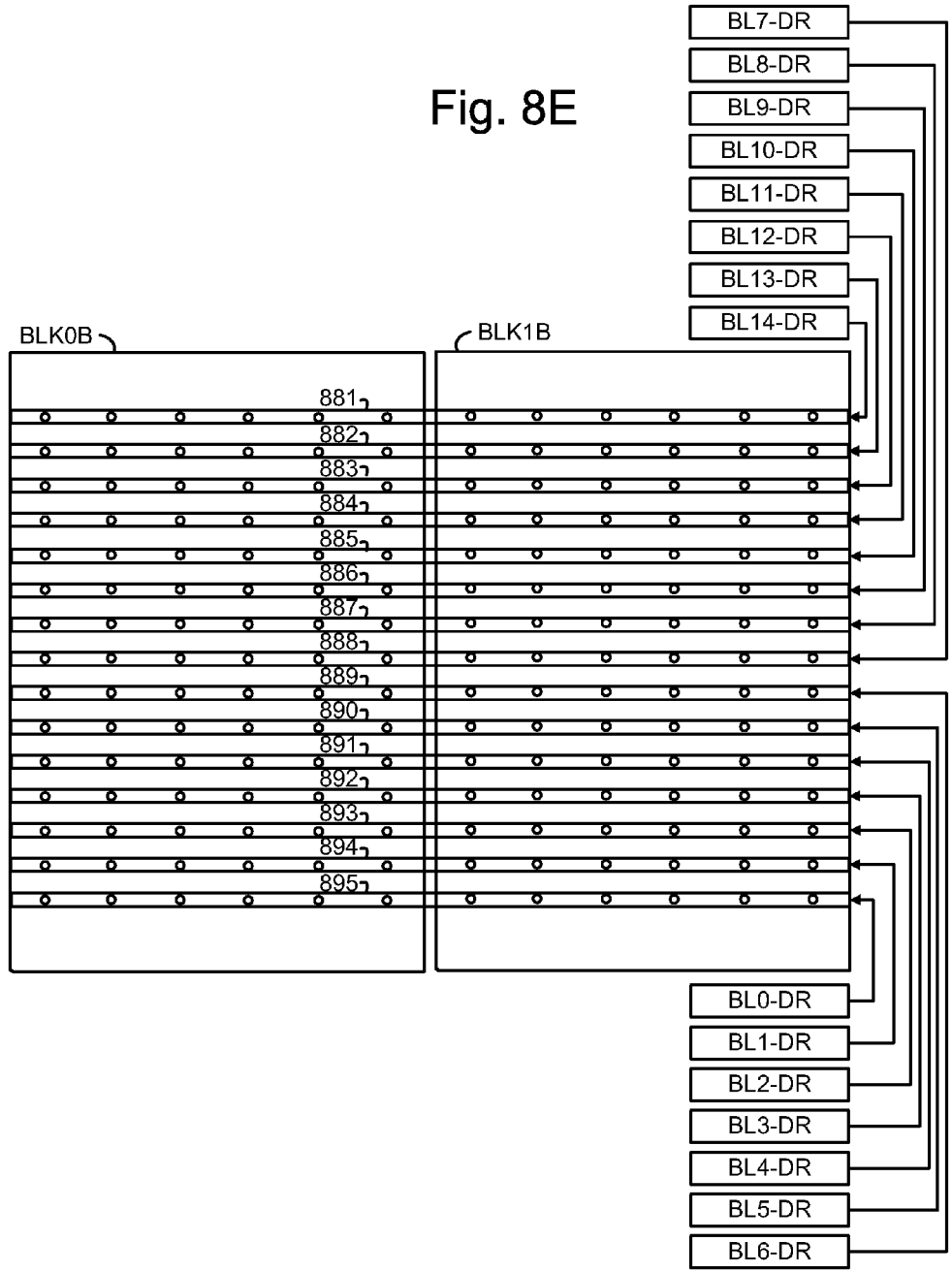
FIG. 8E depicts a top view of a bit line layer of the 3D non-volatile memory device of FIG. 8A, showing bit lines and associated drivers.
Figure 8F:
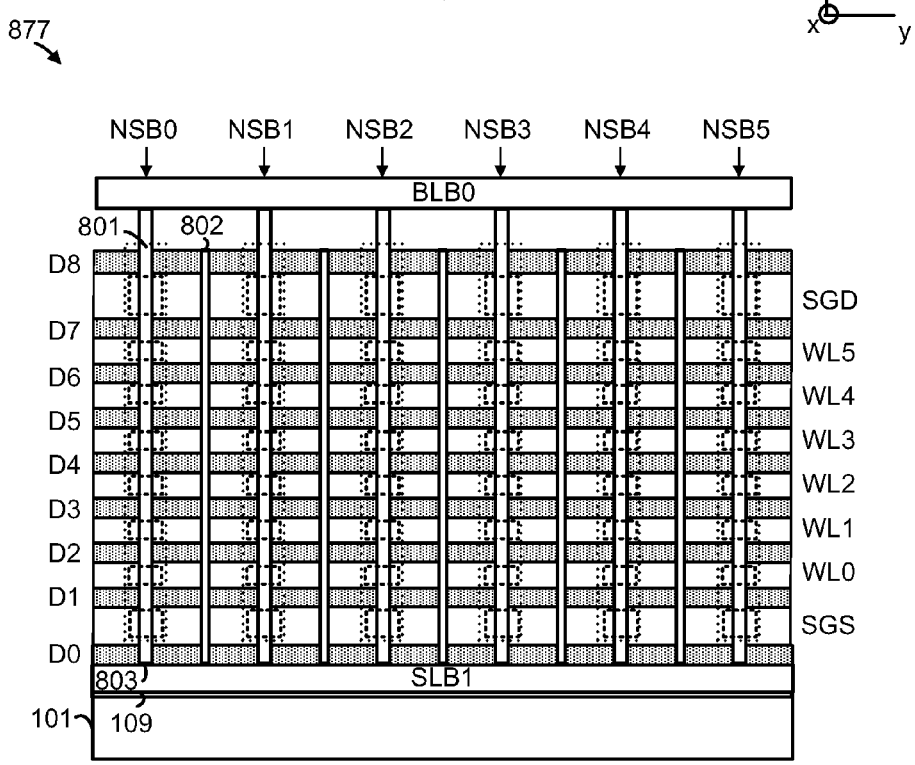
FIG. 8F depicts a cross-sectional view of a block of the 3D non-volatile memory device of FIG. 8A, along line 800 of setB0 of NAND strings FIG. 8A.

A dashed line 800 extends through columns C0 to C6, shown in cross-section in FIG. 8F. Each block can include sub-blocks of columns of memory cells, such as sub-blocks 804 to 809 in BLK0B and sub-blocks 810 to 815 in BLK1B.

FIG. 8B depicts a top view of a select gate layer of the 3D non-volatile memory device of FIG. 8A, showing drain-side select gate lines and associated drivers. For example, this can represent layer SGD of FIG. 8F. A separate drain-side select gate line, e.g., a conductive line or path, may be associated with each row of columns of memory cells. For example, BLK0B includes select gate lines 820 to 825, which are driven by select gate drivers SGD0-DR to SGD5-DR, respectively. BLK1B includes select gate lines 826 to 831, which are driven by select gate drivers SGD6-DR to SGD11-DR, respectively. The select gate drivers provide signals such as voltage waveforms to the select gate lines.

FIG. 8C depicts a top view of a select gate layer of the 3D non-volatile memory device of FIG. 8A, showing source-side select gate lines and associated drivers. For example, this can represent layer SGS of FIG. 8F. A separate source-side select gate line, e.g., a conductive line or path, is associated with each row of columns of memory cells. For example, BLK0B includes select gate lines 840 to 846, which are driven by select gate drivers SGS0B0-DR to SGS05B-DR, respectively. BLK1B includes select gate lines 846 to 851, which are driven by select gate drivers SGS1B0-DR to SGS1B5-DR, respectively. The select gate drivers provide signals such as voltage waveforms to the select gate lines.

FIG. 8D depicts a top view of a source line layer of the 3D non-volatile memory device of FIG. 8A, showing source lines and associated drivers. For example, this can represent layer SL of FIG. 8F. A source line, e.g., a conductive line or path, is associated with a set of columns of memory cells which extend in a horizontal line in the figure. A source line extends across multiple blocks which are adjacent laterally of one another. A source line is connected to a source-side end of a NAND string, e.g., to a vertical channel or body of the NAND string. For example, source lines 861 to 875 are driven by source line driver SL-DR. The source line driver provides a signal such as a voltage waveform to the source-side ends of the NAND strings.

FIG. 8E depicts a top view of a bit line layer of the 3D non-volatile memory device of FIG. 8A, showing bit lines and associated drivers for BLK0B and BLK1B. For example, this can represent layer BL of FIG. 8F. A bit line, e.g., a conductive line or path, is associated with a set of columns of memory cells which extend in a horizontal line in the figure. A bit line extends across multiple blocks which are adjacent laterally of one another. A bit line is connected to a drain-side end of a NAND string, e.g., to a vertical channel or body of the NAND string. For example, bit lines 881 to 895 are driven by bit line drivers BL0-DR to BL14-DR, respectively. The bit line drivers provide signals such as voltage waveforms to the drain-side ends of the NAND strings.

FIG. 8F depicts a cross-sectional view of a block of the 3D non-volatile memory device of FIG. 8A, along line 800 of setB0 of NAND strings FIG. 8A. Columns of memory cells corresponding to NAND strings NSB0 to NSB5, respectively, are depicted in the multi-layer stack. The stack 877 includes a substrate 101, an insulating film 109 on the substrate, and a portion of a source line 863. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 803 and a drain end 801. The slit 802 from FIG. 8A is also depicted with other slits. A portion of the bit line BLB0 is also depicted. Dashed lines depict memory cells and select gates, as discussed further below.

FIG. 9 depicts an arrangement of memory cells in an example set of NAND strings such as SetB0 in FIG. 8F. NAND strings NSB0 to NSB5 are depicted. A similar notation as used above is provided. In this erase process, all of the memory cells of WL3 (namely MC3,0 to MC3,5) are selected to be erased. The memory cells of WL0-WL2, WL4 and WL4 are unselected.

Accordingly, it can be seen that, in one embodiment, a 3D stacked non-volatile memory device includes: (1) a substrate, (2) a stacked non-volatile memory cell array carried by the substrate, the stacked non-volatile memory cell array comprising a memory string, the memory string comprising a plurality of memory cells between a first select transistor (SGD/SGS) at a first end of the memory string and a second select transistor (SGS/SGD) at a second end of the memory string, the first end of the memory string connected to a first control line (BL/SL), and the second end of the memory string connected to a second control line (SL/BL); and (3) at least one control circuit in communication with the stacked non-volatile memory cell array, the first control line and the second control line, the at least one control circuit, to perform each erase iteration of a plurality of erase iterations of an erase operation for one or more memory cells of the memory string: performs: (a) a preparation phase in which a voltage (Vbl or Vsl) of at least the first control line and a voltage of at least the first select transistor (Vsgs, Vsgd) are driven higher (Vsg0, Vsg1, . . . ), such that the voltage (Vbl or Vsl) of the at least the first control line does not exceed the voltage of the at least the first select transistor (Vsgs, Vsgd) by a sufficient margin to charge up a channel of the memory string by gate-induced drain leakage at the at least the first select transistor, (b) a charge up phase in which a voltage (Vwl-selected) of a control gate of each of the one or more memory cells floats, and the voltage of the first control line is driven higher to a level (Verase0, Verase1, . . . ) which exceeds the voltage (Vsg0, Vsg1, . . . ) of the at least the first select transistor (Vsgs, Vsgd) by the sufficient margin to charge up the channel of the memory string by gate-induced drain leakage at the at least the first select transistor, and (c) an erase phase in which the voltage of the control gate of each of the one or more memory cells is driven lower.

In another embodiment, a corresponding method for performing an erase operation for one or more memory cells of a memory string in a 3D stacked non-volatile memory device is provided. The method includes performing each erase iteration of a plurality of erase iterations of the erase operation by: (a) performing a preparation phase by driving higher (Vsg0, Vsg1, . . . ) a voltage (Vbl or Vsl) of at least a first control line connected to a first end of the memory string, and a voltage of at least a first select transistor (Vsgs, Vsgd) connected to a second end of the memory string, such that the voltage (Vbl or Vsl) of the at least the first control line does not exceed the voltage of the at least the first select transistor (Vsgs, Vsgd) by a sufficient margin to charge up a channel of the memory string by gate-induced drain leakage at the at least the first select transistor, (b) performing a charge up phase by floating a voltage (Vwl-selected) of a control gate of each of the one or more memory cells, and driving higher the voltage of the first control line to a level (Verase0, Verase1, . . . ) which exceeds the voltage (Vsg0, Vsg1, . . . ) of the at least the first select transistor (Vsgs, Vsgd) by the sufficient margin to charge up the channel of the memory string by gate-induced drain leakage at the at least the first select transistor, and (c) performing an erase phase by driving lower the voltage of the control gate of each of the one or more memory cells.

In another embodiment, a 3D stacked non-volatile memory device includes: (1) a substrate; (2) a stacked non-volatile memory cell array carried by the substrate, the stacked non-volatile memory cell array comprising a memory string, the memory string comprising a plurality of memory cells between a first select transistor (SGD/SGS) at a first end of the memory string and a second select transistor (SGS/SGD) at a second end of the memory string, the first end of the memory string connected to a first control line (BL/SL), and the second end of the memory string connected to a second control line (SL/BL); and (3) at least one control circuit in communication with the stacked non-volatile memory cell array, the first control line and the second control line, the at least one control circuit, to perform each erase iteration of a plurality of erase iterations of an erase operation for one or more memory cells of the memory string: drives a voltage (Vbl or Vsl) of at least the first control line and a voltage of at least the first select transistor (Vsgs, Vsgd) higher (Verase0, Verase1, . . . ; Vsg0, Vsg1, . . . ), such that the voltage (Vbl or Vsl) of the at least the first control line exceeds the voltage of the at least the first select transistor (Vsgs, Vsgd) by a sufficient margin to charge up a channel of the memory string by gate-induced drain leakage at the at least the first select transistor, while a voltage (Vwl-selected) of a control gate of each of the one or more memory cells initially floats and subsequently is driven lower, the voltage (Vsg0, Vsg1, . . . ) to which the at least the first control line is driven increases in at least one erase iteration of the plurality of erase iterations according to at least one respective step size (Verase-step), and the voltage (Verase0, Verase1, . . . ) to which the at least the first select transistor is driven increases in the at least one erase iteration of the plurality of erase iterations according to at least one respective step size (Vsg-step).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A 3D stacked non-volatile memory device, comprising:
a substrate;
a stacked non-volatile memory cell array carried by the substrate, the stacked non- volatile memory cell array comprising a memory string, the memory string comprising a plurality of memory cells between a first select transistor at a first end of the memory string and a second select transistor at a second end of the memory string, the first end of the memory string connected to a first control line, and the second end of the memory string connected to a second control line; and
a control circuit in communication with the stacked non-volatile memory cell array, the first control line and the second control line, the control circuit, to perform each erase iteration of a plurality of erase iterations of an erase operation for one or more memory cells of the memory string, is configured to perform:
  a preparation phase in which a voltage of the first control line and a voltage of the first select transistor are driven higher, such that the voltage of the first control line does not exceed the voltage of the first select transistor by a sufficient margin to charge up a channel of the memory string by gate-induced drain leakage at the first select transistor,
  a charge up phase in which a voltage of a control gate of each of the one or more memory cells floats, and the voltage of the first control line is driven higher to a level which exceeds the voltage of the first select transistor by the sufficient margin to charge up the channel of the memory string by gate-induced drain leakage at the first select transistor, wherein the voltage to which the first control line is driven in the charge up phase increases in an erase iteration of the plurality of erase iterations according to a first respective step size, and the voltage to which the first select transistor is driven in the preparation phase increases in the erase iteration of the plurality of erase iterations according to a second respective step size, and
  an erase phase in which the voltage of the control gate of each of the one or more memory cells is driven lower.

2. The 3D stacked non-volatile memory device of claim 1, wherein:
the voltages to which the first control line and the first select transistor are driven in the preparation phase are equal for at least one erase iteration of the plurality of erase iterations.

3. The 3D stacked non-volatile memory device of claim 1, wherein:
the voltage to which the first select transistor is driven in the preparation phase is maintained in the charge up phase and the erase phase.

4. The 3D stacked non-volatile memory device of claim 1, wherein:
the voltage to which the first control line is driven in the charge up phase is maintained in the erase phase.

5. The 3D stacked non-volatile memory device of claim 1, wherein:
the first control line comprises a bit line or a source line.

6. The 3D stacked non-volatile memory device of claim 1, wherein:
the memory string comprises a straight NAND string.

7. The 3D stacked non-volatile memory device of claim 1, wherein:
the memory string comprises a U-shaped NAND string.

8. The 3D stacked non-volatile memory device of claim 1, wherein:
the voltage to which the first control line is driven in the charge up phase, and the voltage to which the first select transistor is driven in the preparation phase, increase according to a common step size in an erase iteration of the plurality of erase iterations.

9. The 3D stacked non-volatile memory device of claim 1, wherein:
the voltage to which the first control line is driven in the charge up phase is fixed for two successive erase iterations of the plurality of erase iterations, and increases in an additional erase iteration of the plurality of erase iterations according to the first respective step size; and
the voltage to which the first select transistor is driven in the preparation phase is fixed for the two successive erase iterations of the plurality of erase iterations, and increases in the successive erase iterations of the plurality of erase iterations according to the second respective step size.

10. The 3D stacked non-volatile memory device of claim 9, wherein:
the additional erase iteration is predetermined.

11. The 3D stacked non-volatile memory device of claim 9, wherein:
the additional erase iteration is adaptively determined.

12. A method for performing an erase operation for one or more memory cells of a memory string in a 3D stacked non-volatile memory device, comprising:
performing each erase iteration of a plurality of erase iterations of the erase operation by:
performing a preparation phase by driving higher a voltage of a first control line connected to a first end of the memory string, and a voltage of a first select transistor connected to the first end of the memory string, such that the voltage of the first control line does not exceed the voltage of the first select transistor by a sufficient margin to charge up a channel of the memory string by gate-induced drain leakage at the first select transistor,
performing a charge up phase by floating a voltage of a control gate of each of the one or more memory cells, and driving higher the voltage of the first control line to a level which exceeds the voltage of the first select transistor by the sufficient margin to charge up the channel of the memory string by gate-induced drain leakage at the first select transistor, wherein the voltage to which the first control line is driven in the charge up phase is fixed for two successive erase iterations of the plurality of erase iterations, and increases in an additional erase iteration of the plurality of erase iterations according to a first respective step size, and the voltage to which the first select transistor is driven in the preparation phase is fixed for the two successive erase iterations of the plurality of erase iterations, and increases in the successive erase iterations of the plurality of erase iterations according to a second respective step size, and
performing an erase phase by driving lower the voltage of the control gate of each of the one or more memory cells.

13. The method of claim 12, wherein:
the voltage to which the first select transistor is driven in the preparation phase is maintained in the charge up phase and the erase phase.

14. The method of claim 12, wherein:
the voltage to which the first control line is driven in the charge up phase is maintained in the erase phase.

15. The method of claim 12, wherein:
the first control line comprises a bit line or a source line.

16. The method of claim 12, wherein:
the voltage to which the first control line is driven in the charge up phase increases in an erase iteration of the plurality of erase iterations according to the first respective step size; and
the voltage to which the first select transistor is driven in the preparation phase increases in the erase iteration of the plurality of erase iterations according to the second respective step size.

17. The method of claim 16, wherein:
the voltage to which the first control line is driven in the charge up phase, and the voltage to which the first select transistor is driven in the preparation phase, increase according to a common step size in an erase iteration of the plurality of erase iterations.

18. A 3D stacked non-volatile memory device, comprising:
a stacked non-volatile memory cell array, the stacked non-volatile memory cell array comprising a memory string, the memory string comprising a plurality of memory cells between a first select transistor at a first end of the memory string and a second select transistor at a second end of the memory string, the first end of the memory string connected to a first control line, and the second end of the memory string connected to a second control line; and
a control circuit in communication with the stacked non-volatile memory cell array, the first control line and the second control line, the control circuit, to perform each erase iteration of a plurality of erase iterations of an erase operation for one or more memory cells of the memory string, performs:
a preparation phase in which a voltage of the first control line and a voltage of the first select transistor are driven higher, such that the voltage of the first control line does not exceed the voltage of the first select transistor by a sufficient margin to charge up a channel of the memory string by gate-induced drain leakage at the first select transistor,
a charge up phase in which a voltage of a control gate of each of the one or more memory cells floats, and the voltage of the first control line is driven higher to a level which exceeds the voltage of the first select transistor by the sufficient margin to charge up the channel of the memory string by gate-induced drain leakage at the first select transistor, wherein the voltage to which the first control line is driven in the charge up phase increases in an erase iteration of the plurality of erase iterations according to a first respective step size, and the voltage to which the first select transistor is driven in the preparation phase increases in the erase iteration of the plurality of erase iterations according to a second respective step size, and an erase phase in which the voltage of the control gate of each of the one or more memory cells is driven lower.

19. The 3D stacked non-volatile memory device of claim 18, wherein:
the voltages to which the first control line and the first select transistor are driven in the preparation phase are equal for at least one erase iteration of the plurality of erase iterations.

20. The 3D stacked non-volatile memory device of claim 18, wherein:
the voltage to which the first select transistor is driven in the preparation phase is maintained in the charge up phase and the erase phase.

21. The 3D stacked non-volatile memory device of claim 18, wherein:
the voltage to which the first control line is driven in the charge up phase is maintained in the erase phase.

22. The 3D stacked non-volatile memory device of claim 18 wherein:
the first control line comprises a bit line or a source line.

23. The 3D stacked non-volatile memory device of claim 18, wherein:
the memory string comprises a straight NAND string.

24. The 3D stacked non-volatile memory device of claim 18, wherein:
the memory string comprises a U-shaped NAND string.

25. The 3D stacked non-volatile memory device of claim 18, wherein:
the voltage to which the first control line is driven in the charge up phase, and the voltage to which the first select transistor is driven in the preparation phase, increase according to a common step size in an erase iteration of the plurality of erase iterations.

26. The 3D stacked non-volatile memory device of claim 18, wherein:
the voltage to which the first control line is driven in the charge up phase is fixed for two successive erase iterations of the plurality of erase iterations, and increases in an additional erase iteration of the plurality of erase iterations according to the first respective step size; and
the voltage to which the first select transistor is driven in the preparation phase is fixed for the two successive erase iterations of the plurality of erase iterations, and increases in the successive erase iterations of the plurality of erase iterations according to the second respective step size.

27. The 3D stacked non-volatile memory device of claim 26, wherein:
the additional erase iteration is predetermined.

28. The 3D stacked non-volatile memory device of claim 26, wherein:
the additional erase iteration is adaptively determined.

* * * * *